United States Patent [19]

Hosogi

[11] Patent Number: 5,449,929
[45] Date of Patent: Sep. 12, 1995

[54] IPG TRANSISTOR SEMICONDUCTOR INTEGRATED CIRCUIT DEVICE

[75] Inventor: Kenji Hosogi, Itami, Japan

[73] Assignee: Mitsubishi Denki Kabushiki Kaisha, Tokyo, Japan

[21] Appl. No.: 169,141

[22] Filed: Dec. 20, 1993

[30] Foreign Application Priority Data

Dec. 21, 1992 [JP] Japan .................................. 4-356619
May 31, 1993 [JP] Japan .................................. 5-128623

[51] Int. Cl.⁶ ........................................... H01L 29/80
[52] U.S. Cl. .................................... 257/194; 257/195; 257/276
[58] Field of Search ................ 257/194, 195, 27, 24, 257/621, 276

[56] References Cited

U.S. PATENT DOCUMENTS

| | | | |
|---|---|---|---|
| 4,989,052 | 1/1991 | Okada et al. | 257/194 |
| 4,999,682 | 3/1991 | Xu et al. | 257/13 |
| 5,185,534 | 2/1993 | Sakamoto et al. | 257/276 |
| 5,270,556 | 12/1993 | Shimura | 257/24 |

FOREIGN PATENT DOCUMENTS

| | | | |
|---|---|---|---|
| 60-149169 | 8/1985 | Japan | 257/194 |
| 61-170072 | 7/1986 | Japan . | |
| 62-169483 | 7/1987 | Japan . | |
| 63-168 | 1/1988 | Japan . | |
| 6428871 | 1/1989 | Japan . | |
| 1-185943 | 7/1989 | Japan | 257/621 |
| 3-50773 | 3/1991 | Japan | 257/194 |
| 2046514 | 11/1980 | United Kingdom | 257/621 |

OTHER PUBLICATIONS

Glazman et al., "Lateral Position Control of an Electron Channel in a Split-Gate Device", Semiconductor Science Technology 6 (1991) pp. 32–35.

Nieder et al, "One-Dimensional Lateral-Field-Effect Transistor With Trench Gate-Channel Insulation", Applied Physics Letters, vol. 57, No. 25, Dec. 1990, pp. 2695–2697.

Primary Examiner—Jerome Jackson
Assistant Examiner—Courtney A. Bowers
Attorney, Agent, or Firm—Leydig, Voit & Mayer

[57] ABSTRACT

A method of producing on a substrate an in-plane-gate transistor includes producing a channel portion in which a quasi-one-dimensional conductive channel electrically connecting a source region and a drain region is generated and producing gate portions, each portion including a gate electrode layer for controlling generation and forfeiture of the quasi-one-dimensional conductive channel so that an upper surface of the gate layer and the quasi-one-dimensional conductive channel are positioned substantially in the same plane, on both sides of the channel portion on the substrate. Gaps between the channel portion and the gate portions are controlled by side walls produced self-aligningly on the side wall surfaces of the channel portion. Thus, gaps of a high aspect ratio can be produced between the channel portion and the gate portions without being limited by the dry etching technique.

9 Claims, 25 Drawing Sheets

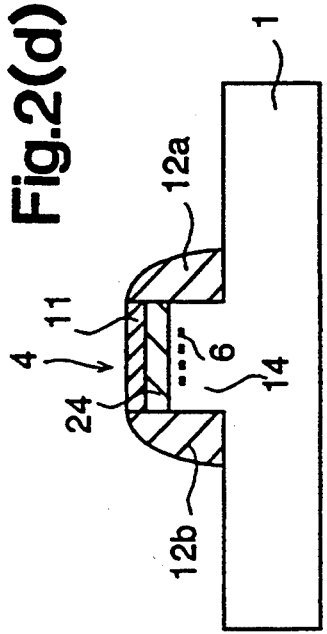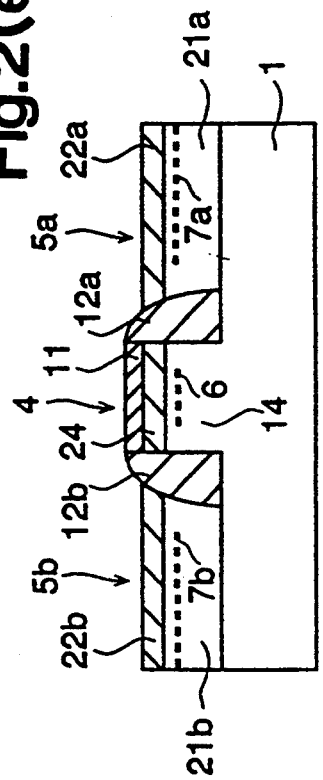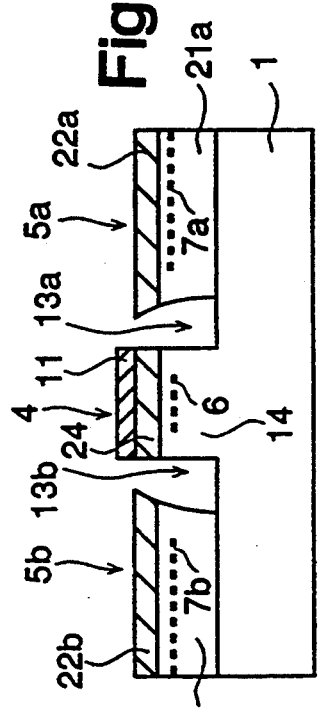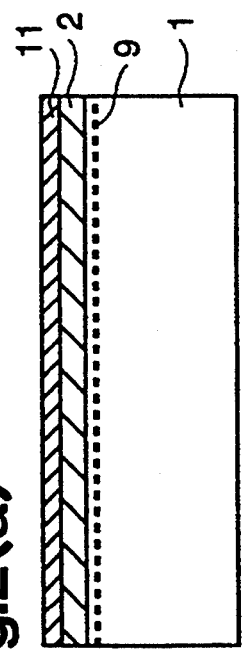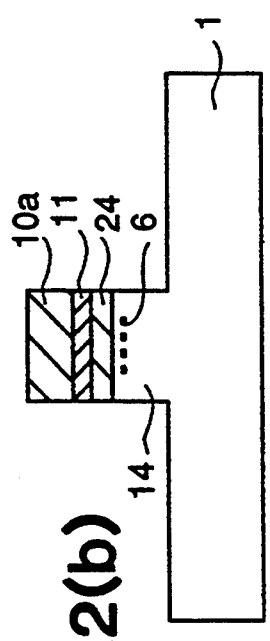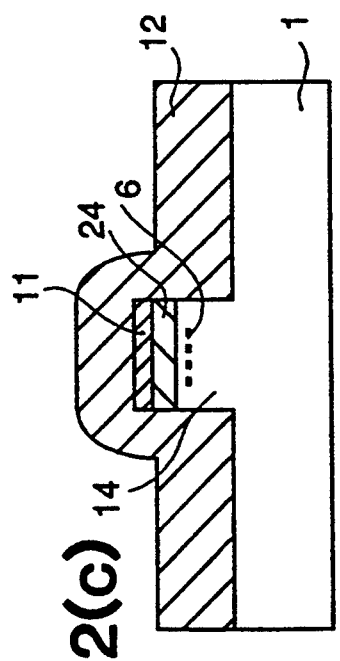

120

120

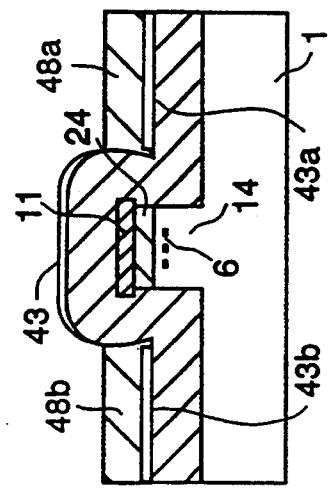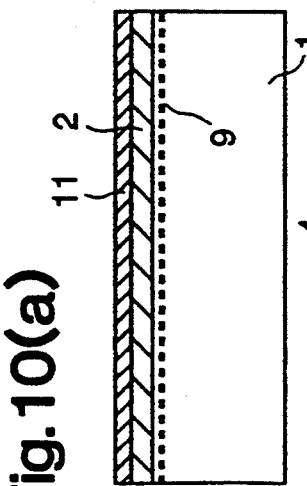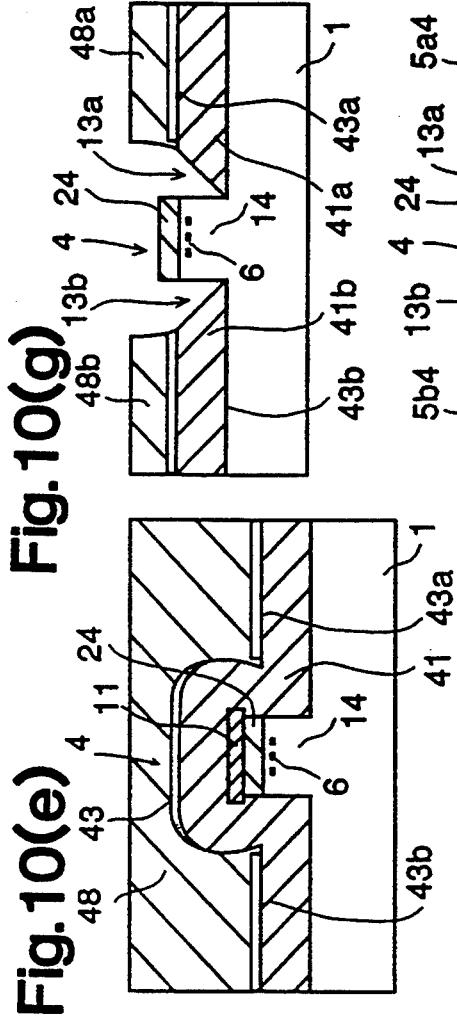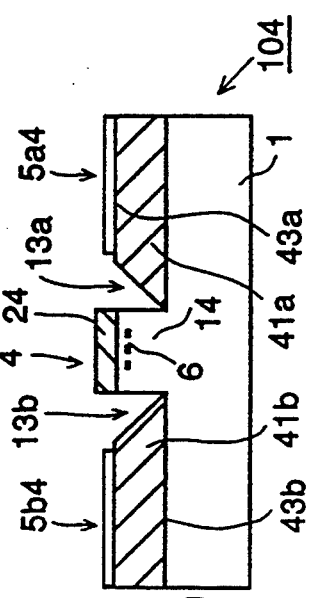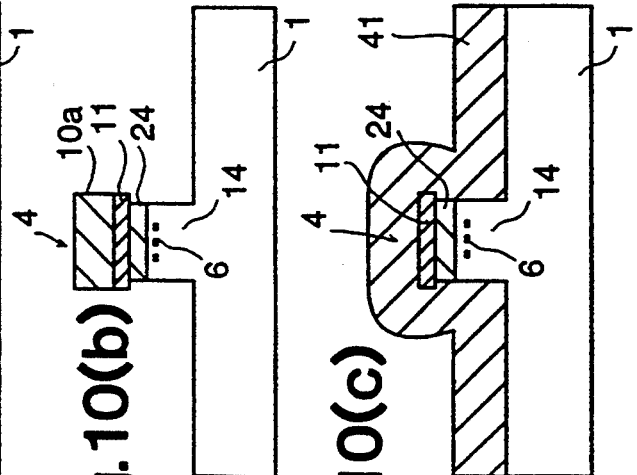

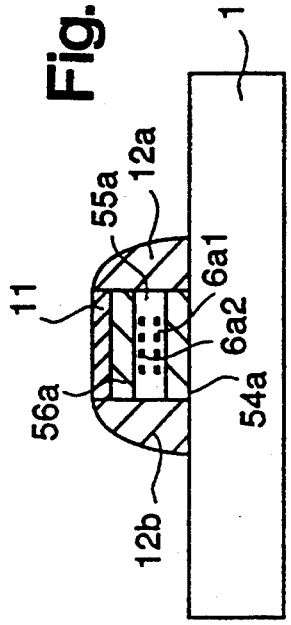
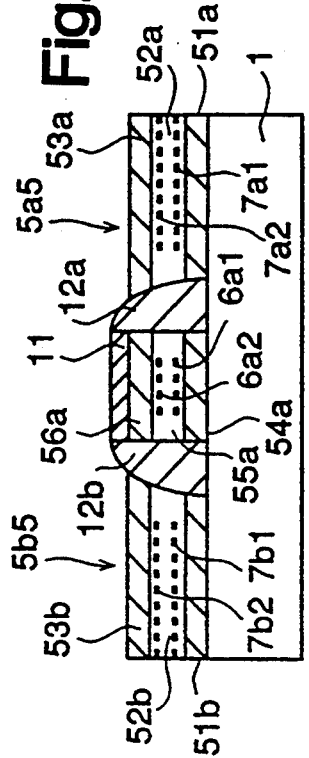
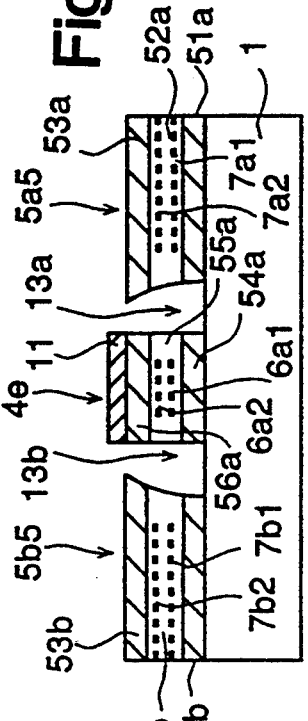
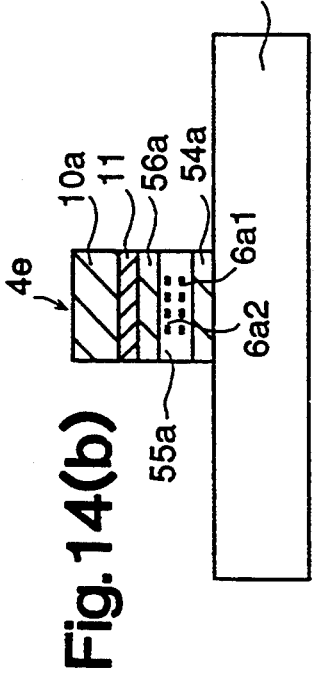
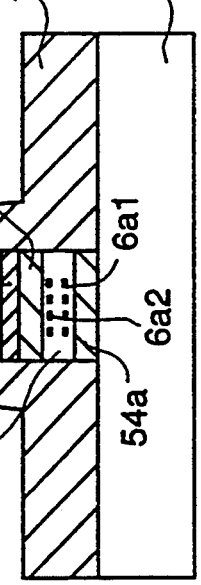
Fig.14(a) Fig.14(b) Fig.14(c) Fig.14(d) Fig.14(e) Fig.14(f)

X: {112} direction

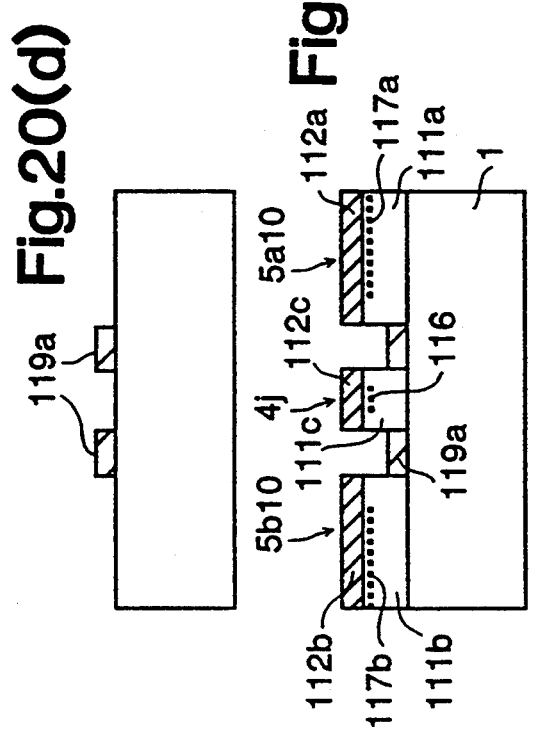
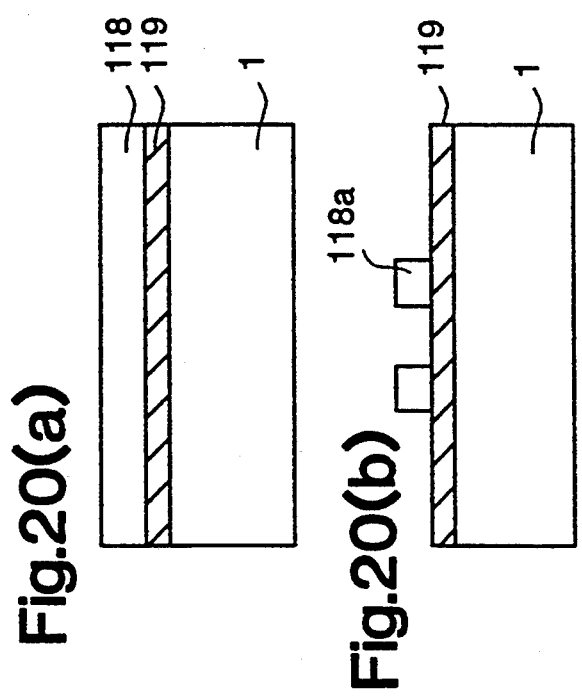
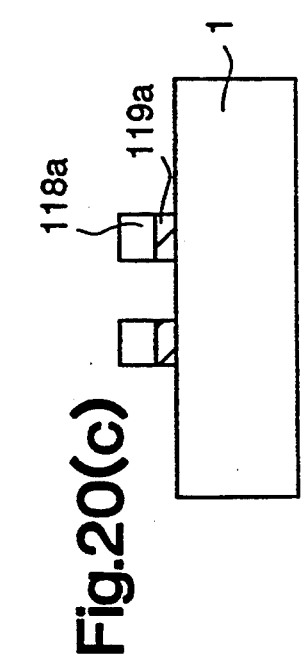

IPG TRANSISTOR SEMICONDUCTOR INTEGRATED CIRCUIT DEVICE

FIELD OF THE INVENTION

The present invention relates to a production method of an IPG transistor, a semiconductor integrated circuit device and a production method thereof, and more particularly, to an in-plane-gate (hereinafter referred to as "IPG") transistor that has improved the mutual conductance so as to operate at a super high frequency above millimeter wave and at a super high speed and a production method thereof. Further, the invention relates to a semiconductor integrated circuit device that has mounted the IPG transistors integrated, and a production method thereof.

BACKGROUND OF THE INVENTION

The basic idea of the transistor structure in accordance with the present invention is based on a structure called an IPG, for example, a structure in which a gate controlling a channel comprises a two-dimensional electron gas layer and the like, and the IPG transistor described below is recited in "Applied Physics Letters 1990, Vol. 57, No. 25, pp. 2695 to 2697".

FIG. 21 is a perspective view illustrating a schematic construction of a prior art IPG transistor, FIG. 22(a) is a cross-sectional view of FIG. 21 in line A—A, and FIG. 22(b) is a plan view illustrating a layout of a source, a drain and a gate portion of the IPG transistor. In the IPG transistor 200 shown in the figures, a source region 8 and a drain region 9 are disposed on a semi-insulating GaAs substrate 1 with a predetermined interval therebetween, and a channel portion 4 electrically connecting between these regions is disposed between both the regions.

The source and drain regions 8 and 9 and the channel portion 4 respectively comprise GaAs parts 18, 19, and 14 having a prescribed plane configuration projecting on the substrate 1, and n type AlGaAs layers 28, 29, and 24 disposed on the respective GaAs parts 18, 19, and 14. A quite thin electron conductive layer as about 10 nm thickness called as a two-dimensional electron gas (hereinafter referred to as "2DEG") layer is produced at a portion of each the GaAs part in the vicinity of the interface with the n type AlGaAs layer.

The element structure in which a two-dimensional electron gas layer is produced in a semiconductor layer as described above is fundamentally the same as that used in transistors such as a HEMT (High Electron Mobility Transistor) and an MODFET (Modulation Doped FET), which are generally employed as high performance elements for microwave. The above-described IPG transistor is only different in the structure of the channel portion 4 from the HEMT or the MODFET.

In more detail, in the IPG transistor 200, the channel portion 4 is processed so as to have quite a small width as 0.6 μm as recited in the above-described reference, and the electrons at the electron conductive layer of the channel portion 4 are confined in a further narrower region affected by the surface depletion layers extending from the side surfaces of the channel portion. Therefore, the electrons run in a quasi-one-dimensional fine line region (hereinafter alternatively referred to as a "Q1D conductive channel") at the channel portion 4. FIG. 22(b) shows a flow of an electron e running through the channel portion 4 from the source region 8 toward the drain electrode 9.

Gate portions 5a and 5b are disposed at both sides of the channel portion 4 with predetermined intervals from the channel portion 4. Both the gate portions 5a and 5b comprise GaAs portions 15a and 15b each having a prescribed plane configuration projecting on the substrate 1 and n type AlGaAs layers 25a and 25b disposed on the respective GaAs portions similarly to the channel portion 4. Two-dimensional electron gas layers 7a and 7b are produced at portions of the respective GaAs portions 15a and 15b in the vicinity of the interfaces with the n type AlGaAs layers 25a and 25b. Here, gap grooves 3a and 3b separate the channel portion 4 where a current flows and the gate portions 5a and 5b.

A source electrode 209 and a drain electrode 208 comprising Au-Ge alloy or the like are disposed at the source and drain regions 8 and 9, respectively, and gate electrodes 205a and 205b comprising Au-Ge alloy or the like are disposed on the gate portions 5a and 5b, respectively.

FIG. 23 shows a detailed semiconductor layer structure of the IPG transistor. In the figure, the same reference numerals as those in FIG. 22 designate the same elements. An intrinsic GaAs (hereinafter referred to as "i type GaAs") buffer layer 1a of about 1 μm thickness is produced on the semi-insulating GaAs substrate 1. An i type GaAs active layer 1b of high purity of about 1000 Å (100 nm) thickness is produced on the buffer layer 1a. An i type AlGaAs layer 2a is produced between the i type GaAs layer 1b and an n type AlGaAs layer 2, and the two-dimensional electron gas layers 7a and 7b are produced at portions of the i type GaAs layer 1b in the vicinity of the interface with the i type AlGaAs layer 2a.

In addition, the Au-Ge alloy electrodes 205a and 205b are disposed on the n type AlGaAs layer 2 via a relatively thick n type GaAs layer 2b. The n type GaAs layer 2b is disposed between the Au-Ge alloy electrodes and the n type AlGaAs layer 2 so as to substantially reduce the resistance of the n type AlGaAs layer 2 which is a relatively high resistance as well as to obtain an ohmic contact between the Au-Ge alloy electrodes and the n type AlGaAs layer 2.

The production method will be described below.

First of all, the n type AlGaAs layer 2 into which Si is doped at a high concentration is epitaxially grown on the semi-insulating GaAs substrate 1 as shown in FIG. 24(a). In this state, a thin conductive layer 9 comprising two-dimensional electron gas is produced at a portion of the GaAs substrate 1 in the vicinity of the hetero interface with the n type AlGaAs layer 2.

Here, in the actual production process, the i type GaAs buffer layer 1a, the i type GaAs active layer 1b, and the i type AlGaAs layer 2a into which layers no impurity is doped are successively grown as shown in FIG. 23, but these semiconductor layers are not shown in FIG. 24 because these layers have no relation to the essence of the operation of the device. Thus, while successively laminating a plurality of semiconductor layers, impurity is selectively doped only into a prescribed semiconductor layer, and this is generally called a selective doping method.

Next, a photoresist film 10 is applied on the entire surface as shown in FIG. 24(b), and the photoresist film 10 is patterned by performing exposure and development to the photoresist film 10, thereby producing a photoresist mask 10b as shown in FIG. 24(c). Because a precise dimension control is required in this patterning, a technique of electron beam patterning is employed for producing the exposure pattern, and for this reason, PMMA (Polymethyl Methacylate) having sensitivity against electron beam is employed as the photoresist 10.

Subsequently, the n type AlGaAs layer 2 and the surface portion of the GaAs substrate 1 therebelow are etched vertically by the dry etching technique called RIE (Reactive Ion Etching) using the photoresist mask 10b as a mask, thereby producing the channel portion 4 and the gate portions 5a and 5b as shown in FIG. 24(d).

In other words, as shown in FIG. 24(d), a portion put between the two gap grooves 3a and 3b produced by the above-described etching is the channel portion 4, and the portions confronting via the gap grooves at both sides of the channel portion 4 are the gate portions 5a and 5b. In this state, since the two-dimensional electron gas layer in the channel portion 4 is pushed from both sides by the surface potential of the side surfaces of the channel portion 4 toward the center of the channel portion 4, it has a width of below about 0.2 μm when the width of the channel portion 4 is 0.6 μm as shown in the figure, resulting in that the two-dimensional electron gas layer becomes a quasi-one-dimensional electron system (hereinafter alternatively referred to as Q1DES), i.e., a quasi-one-dimensional conductive channel 6.

Thereafter, the photoresist mask 10b is removed and formation of electrodes and the like are carried out, thereby completing the IPG transistor 200 (refer to FIG. 21 and FIG. 22(a)). Then, the IPG transistor 200 is a depletion type one in which the quasi-one-dimensional conductive channel 6 is produced at the channel portion 4 in a state where no gate voltage is applied to the gate portions 5a and 5b as shown in FIG. 22(a).

The operation of this IPG transistor will be described below.

In the depletion type IPG transistor 200 of the above-described structure, when no gate voltage is applied to the gate portions 5a and 5b, at the portions X1 in the vicinity of the both side end surfaces of the channel portion 4, the potential level at the surface of the GaAs substrate 1 rises up affected by the surface depletion layers as shown in FIG. 25(b), and no two-dimensional electron gas layer is produced, while at the center portion X2 of the channel portion 4, the influences of the surface depletion layers are small, and the channel 6 comprising the two-dimensional electron gas is produced at a portion of the GaAs substrate 1 in the vicinity of the interface with the AlGaAs layer, where the potential level of electron is fallen down as shown in FIG. 25(c). In this state, the IPG transistor 200 is in an on state where the region between the source and drain regions 8 and 9 is electrically connected by the quasi-one-dimensional conductive channel 6.

When a gate voltage is applied to the gate portions 5a and 5b, also at the center portion X2 of the channel portion 4 (refer to FIG. 25(c) and FIG. 26(c)), the potential level at the surface of the GaAs substrate 1 rises up affected by the electric fields from the two-dimensional electron gas layers 7a and 7b of the gate portions 5a and 5b as shown in FIG. 26, similarly to the portions X1 in the vicinity of the both side end surfaces of the channel portion 4 (refer to FIG. 25(b) and FIG. 26(b)), and the potential level at the portion of the GaAs substrate 1 in the vicinity of the interface with the AlGaAs layer where the potential level of electron is fallen down also becomes above the Fermi level $E_F$, so that the two-dimensional electron gas layer is forfeited as shown in FIG. 26(c). Then, in the IPG transistor 200, the region between the source region 8 and the drain region 9 is electrically isolated and the IPG transistor 200 is in an off state.

As described above, in the quasi-one-dimensional conductive channel 6 produced at the channel portion 4, because the degree of freedom of electron is made one-dimensional, the improvement in the electron mobility similar to the improvement in the electron mobility which has already achieved by making the three-dimensional conductive channel layer of the two-dimensional is expected, and is thought to contribute to the improving the operation speed of the device.

However, the super high speed operation of the IPG transistor is thought to be realized substantially by the reduction in the gate capacitance rather than the above-described improvement in the electron mobility. More concretely, the IPG transistor has the gap grooves 3a and 3b between the channel portion 4 and the gate portions 5a and 5b, so that the channel portion is separated from the gate portions by vacuum regions or regions filled up with air differently from a conventional FET in which those regions comprise semiconductor or dielectric material, therefore the IPG transistor has a low dielectric constant at the region between the channel and the gate and a small gate capacitance as compared with the conventional FET.

Furthermore, because the IPG transistor has the channel comprising the quasi-one-dimensional electron fine line and the gate comprising the two-dimensional electron gas layer, the structure in which a channel and a gate confront to each other is not a structure in which a plane and a plane confront to each other as in the conventional FET, but a structure in which a line and a line confront to each other, resulting in a small gate capacitance.

In the above-described prior art reference, 10 THz is expected as a cut-off frequency of the IPG transistor which is made on trial, and when it is compared with the conventional semiconductor electronic device the cut off frequency is no more than several hundreds GHz. This means an improvement of the operation speed by no less than one column is expected in the IPG transistor.

In addition, in this IPG transistor, because the channel portion is separated from the gate portions by vacuum regions or regions filled up with air, there is an advantage that there is no likelihood of a gate leakage current which is generated in a state where a forward direction voltage is applied to the gate in the conventional GaAs MESFET.

Although in order to increase the mutual conductance ($g_m$) which is an important performance figure of a transistor, the above-described IPG transistor is required to shorten the interval between the channel and the gate, i.e., the width of the gap grooves 3a and 3b which is about 0.7 μm in the transistor 200, it is not easy to realize using the above-described conventional production method.

In other words, in the conventional dry etching method, it is generally difficult to process an etching groove of a high aspect ratio and when a width of the etching groove is reduced, a depth of the etching is also naturally reduced. In the IPG transistor, when the gap grooves 3a and 3b are shallow, a leakage current flowing through the GaAs substrate between the gate and the channel unfavorably increases, resulting in a problem.

In the conventional IPG transistor described above, because a two-dimensional gas layer is utilized as a gate electrode, a sheet resistance of the two-dimensional electron gas layer comprising AlGaAs/GaAs series material is large as about 1 K$\Omega$, and this results in an obstacle to reducing a parasitic resistance of the gate electrode. In other words, it is necessary to reduce the parasitic resistance for operation of the transistor at a super high speed or at a super high frequency.

Furthermore, in the Q1DES constituting a channel in the IPG transistor, the portion where a current flows is restricted to quite a fine region, so that the current value which can be taken out to the outside in the prior art is very small as about several tens microamperes per one element at the maximum. Electronic circuits at present are usually operated by a current more than several milliamperes with paying consideration on noises or the lime, and for this reason some measure is required to enable its practical use, for example, connecting a plurality of the IPG transistors in parallel with each other at least at a part outputting a signal to the outside so as to increase the output current.

SUMMARY OF THE INVENTION

It is an object of the present invention to provide a production method of an IPG transistor that enables to produce a gap groove of a high aspect ratio between a channel and a gate without receiving restrictions due to the dry etching technique, thereby producing a high performance element having a high mutual conductance.

It is another object of the present invention to provide a semiconductor integrated circuit device having an element structure that enables to produce active elements having different threshold voltages at the same time by a simple process.

It is still another object of the present invention to provide an IPG transistor enabling to reduce a parasitic resistance of a gate controlling a quasi-one-dimensional conductive channel, thereby bringing out a high speed performance of the IPG transistor to the maximum.

It is still another object of the present invention to provide an IPG transistor of a structure that enables to increase the operation current to the degree that is required in usual electronic circuits.

Other objects and advantages of the present invention will become apparent from the detailed description given hereinafter; it should be understood, however, that the detailed description and specific embodiment are given by way of illustration only, since various changes and modifications within the scope of the invention will become apparent to the those skilled in the art from this detailed description.

According to a first aspect of the present invention, a production method of an IPG transistor includes: producing a channel portion where a quasi-one-dimensional conductive channel electrically connecting between a source region and a drain region is generated, on a substrate; and producing gate portions including gate layers for controlling generation and forfeiture of the quasi-one-dimensional conductive channel so that upper surfaces of the gate layers are positioned substantially on the same plane as the quasi-one-dimensional conductive channel, at both sides of the channel portion on the substrate. In the production process of the gate portions, gaps between the channel portion and the gate portions are regulated by side walls which are self-aligningly produced on the side wall surfaces of the channel portion.

A production method of an IPG transistor includes: laminating semiconductor layers on a substrate and patterning the semiconductor layers, thereby producing a channel portion where a quasi-one-dimensional conductive channel electrically connecting between a source region and a drain region is generated; and producing gate portions including two-dimensional electron gas layers for controlling generation and forfeiture of the quasi-one-dimensional conductive channel so that the two-dimensional electron gas layers are positioned on the same plane as the quasi-one-dimensional conductive channel, in the vicinity of the channel portion. In the production process of the gate portions, gaps between the channel portion and the gate portions are regulated by side walls which are self-aligningly produced on the side wall surfaces of the channel portion. Therefore, the gap grooves of a high aspect ratio are produced between the channel and the gates without being limited by the dry etching technique, whereby an IPG transistor of a high element performance having a high mutual conductance and a small gate capacitance is realized. In addition, the gap grooves can be controlled with high precision as well as at high reproducibility, whereby variations in the characteristics of the IPG transistor are suppressed.

According to a second aspect of the present invention, a semiconductor integrated circuit device mounts a plurality of IPG transistors each including a channel portion where a quasi-one-dimensional conductive channel electrically connecting between a source region and a drain region is generated, a gate portion having a two-dimensional electron gas layer disposed on the same plane as the quasi-one-dimensional conductive channel, and a structure that generation and forfeiture of the quasi-one-dimensional conductive channel are controlled by application of a gate voltage to the two-dimensional electron gas layer. As the IPG transistors, there are mounted two types of IPG transistors, that is, a depletion type (hereinafter alternatively referred to as "D type") IPG transistor having a channel portion of a width that is adjusted so that the path between the source region and the drain region is in an electrically conductive state by the quasi-one-dimensional conductive channel in a state where no gate voltage is applied, and an enhancement type (hereinafter alternatively referred to as "E type") IPG transistor having a channel portion of a width that is adjusted so that the quasi-one-dimensional conductive channel is forfeited by the surface depletion layers at both side end parts of the channel portion in a state where no gate voltage is applied.

According to a third aspect of the present invention, a production method of a semiconductor integrated circuit device includes, in the process of producing a photoresist mask by patterning a photoresist film on semiconductor layers which are laminated on a substrate, patterning the semiconductor layers using the photoresist mask, thereby producing a channel portion where a quasi-one-dimensional conductive channel is generated, performing the patterning of the photoresist mask, so that the channel portion has a width where a quasi-one-dimensional conductive channel is produced at a region where the D type IPG transistor is to be formed in a state where no gate voltage is applied, and the channel portion has a width where the quasi-onedimensional conductive channel is forfeited by the surface depletion layers at the side end parts of the channel portion at a region where an E type IPG transistor is to be formed in a state where no gate voltage is applied. Therefore, the type of the transistor is determined dependent on the width of the channel, so that only by varying the pattern width of the mask pattern for patterning the semiconductor layers during the manufacture process, transistors having different threshold voltages are integrated, whereby a semiconductor integrated circuit device mounting, for example, a digital logic circuit is easily manufactured.

According to a fourth aspect of the present invention, an IPG transistor includes gate portions produced at both sides of a channel portion where a quasi-one-dimensional conductive channel is generated, and each the gate portion includes a gate layer for controlling generation and forfeiture of the quasi-one-dimensional conductive channel. Each the gate layer comprises a low resistance semiconductor thin film to which impurity is introduced at a high concentration or a low resistance metal thin film, and each the thin film is provided in each the gate portion so that its upper surface is positioned on approximately the same plane as the quasi-one-dimensional conductive channel. Therefore, a parasitic resistance of the gate electrodes is reduced, thereby bringing out the high speed performance of the IPG transistor to the maximum.

According to a fifth aspect of the present invention, a production method of an IPG transistor includes: producing a channel portion where a quasi-one-dimensional conductive channel is generated on a semiconductor substrate; producing a first insulating film having a larger width than the channel portion on the channel portion; side-etching the channel portion; producing a second insulating film on the entire surface so as to have a overhanging configuration at side surface portions of the channel portion; producing a metal film selectively only on the flat underlying surface; and etching the second insulating film from upper portions of the side surface portions of the channel portion using the photoresist films which are produced at both sides of the channel portion as a mask, thereby lifting-off the metal film on the channel portion, and at the same time, producing gate portions at both sides of the channel portion. Therefore, the gate portions including the metal gate layers for controlling the quasi-one-dimensional conductive channel are disposed self-aligningly with and close to the channel portion.

According to a sixth aspect of the present invention, an IPG transistor includes: a channel portion where a quasi-one-dimensional conductive channel electrically connecting between a source and a drain regions is generated; gate portions each of which has a gate layer for controlling generation and forfeiture of the quasi-one-dimensional conductive channel formed at both sides of the channel portion; and the channel portion having a structure that a plurality of quasi-one-dimensional conductive channels are generated arranged in the thickness direction of the channel portion in parallel with each other. Therefore, the operation current of the IPG transistor can be increased to the degree that is required for usual electronic circuits.

According to a seventh aspect of the present invention, in the above-described IPG transistor, the gate layer comprises a plurality of conductive thin films which are disposed in the gate portion corresponding to the respective quasi-one-dimensional conductive channels, and which upper surfaces are approximately on the same planes as the corresponding quasi-one-dimensional conductive channels, respectively. Therefore, the operation current of the IPG transistor is increased to the degree that is required for usual electronic circuits without inducing deterioration of controllability of the respective quasi-one-dimensional conductive channels.

According to an eighth aspect of the present invention, in the above-described IPG transistor, the gate layer comprises a conductive film which is produced extending from the lowermost one to the uppermost one among the quasi-one dimensional conductive channels. Therefore, the operation current of the IPG transistor is increased to the degree that is required for usual electronic circuits with suppressing an increase in the production process.

According to a ninth aspect of the present invention, an IPG transistor includes a channel portion where a quasi-one-dimensional conductive channel electrically connecting between source and drain regions is generated produced on a substrate, and includes gate portions having gate layers for controlling generation and forfeiture of the quasi-one-dimensional conductive channel produced at both sides of the channel portion on the substrate. Further, in the IPG transistor, the gate layers at the respective gate portions are electrically insulated via air gaps between the gate portions and the channel portion, and are respectively connected to different signal sources from each other. Therefore, a mixer comprising a dual gate transistor element in which signal leakage between the respective gate layers is unlikely to arise, is realized.

According to a tenth aspect of the present invention, a semiconductor integrated circuit device mounts a plurality of IPG transistors each of which includes: a channel portion where a quasi-one-dimensional conductive channel electrically connecting between a source region and a drain region is generated produced on a substrate; and gate portions having gate layers for controlling generation and forfeiture of the quasi-one-dimensional conductive channel produced at both sides of the channel portion on the substrate. Further, the integrated circuit device comprises an air bridge wiring connecting the gate layers of the respective IPG transistors with each other overriding the channel portions between the adjacent gate portions. Therefore, the operation current of the IPG transistor is increased to the degree that is required for usual electronic circuits.

According to an eleventh aspect of the present invention, in the above-described semiconductor integrated circuit device, the channel portion of each the IPG transistor has a structure that a plurality of quasi-one-dimensional conductive channels are generated disposed in the thickness direction of the channel portion in parallel with each other, and the gate layer of each the IPG transistor comprises a plurality of conductive thin films which are disposed corresponding to the quasi-one-dimensional conductive channels in the gate portion so that their upper surfaces are respectively positioned on approximately the same planes as the corresponding quasi-one-dimensional conductive channels. Therefore, a further increase in the operation current of the IPG transistor is achieved.

According to a twelfth aspect of the present invention, a semiconductor integrated circuit device mounts a plurality of IPG transistors each of which comprises a channel portion where a quasi-one-dimensional conductive channel electrically connecting between source and drain regions is generated produced on a substrate, and which comprises gate portions including gate layers for controlling generation and forfeiture of the quasi-one-dimensional conductive channel produced at both sides of the channel portion on the substrate. Further, the substrate has contact holes which are produced penetrating the substrate and a rear surface wiring metal layer which is produced on the rear surface of the substrate, and the gate layers of the respective IPG transistors are connected to the rear surface wiring metal layer through the contact holes. Therefore, the operation current of the IPG transistor is increased to the degree that is required for usual electronic circuits.

According to a thirteenth aspect of the present invention, a production method of an IPG transistor includes: producing a pair of films for selective growth confronting to each other with a prescribed interval on a substrate; producing a channel portion where a quasi-one-dimensional conductive channel electrically connecting between source and drain regions is generated between both the selective growth films on the substrate, by selective growth of semiconductor layers using a pair of selective growth films as a mask; and at the same time, producing gate portions having gate layers for controlling generation and forfeiture of the quasi-one-dimensional conductive channel at the outsides of a region put between by the selective growth films on the substrate. Therefore, gap grooves of a high aspect ratio are realized between the channel and the gates without being limited by the dry etching technique, thereby accomplishing the IPG transistors of a high element performance having a high mutual conductance and a small gate capacitance.

According to a fourteenth aspect of the present invention, in the above-described production method of an IPG transistor, the films for selective growth comprise insulating films of a strip-shaped pattern which are produced in parallel to each other in {112} direction which is the direction of the quasi-one-dimensional conductive channel on (111) surface of the GaAs substrate. Thus, the direction of the strip-shaped pattern of the film is optimized in connection with the crystallographic surface direction of the substrate, so that side walls of semiconductor regrowth layers which are to be produced selectively on the substrate become approximately perpendicular.

BRIEF DESCRIPTION OF THE DRAWINGS

FIG. 2 shows cross-sectional views in the main process steps for explaining a method for producing the transistor in accordance with the first embodiment.

FIGS. 10a–10h are cross-sectional views for explaining a production method of the IPG transistor in accordance with the fourth embodiment.

FIGS. 14a–14f are cross-sectional views for explaining a production method of the IPG transistor in accordance with the fifth embodiment.

FIGS. 20a–20f show cross-sectional in the main process steps for explaining the product method of an IPG transistor in accordance with the tenth embodiment.

FIGS. 25a–26c are diagrams illustrating a quasi-one-dimensional conductive channel layer and band structures in on state of the prior art IPG transistor.

FIGS. 26a–26c are diagrams illustrating the quasi-one-dimensional conductive channel layer and the band structures in off state of the prior art IPG transistor.

DETAILED DESCRIPTION OF PREFERRED EMBODIMENTS

Embodiment 1

Figure 1:
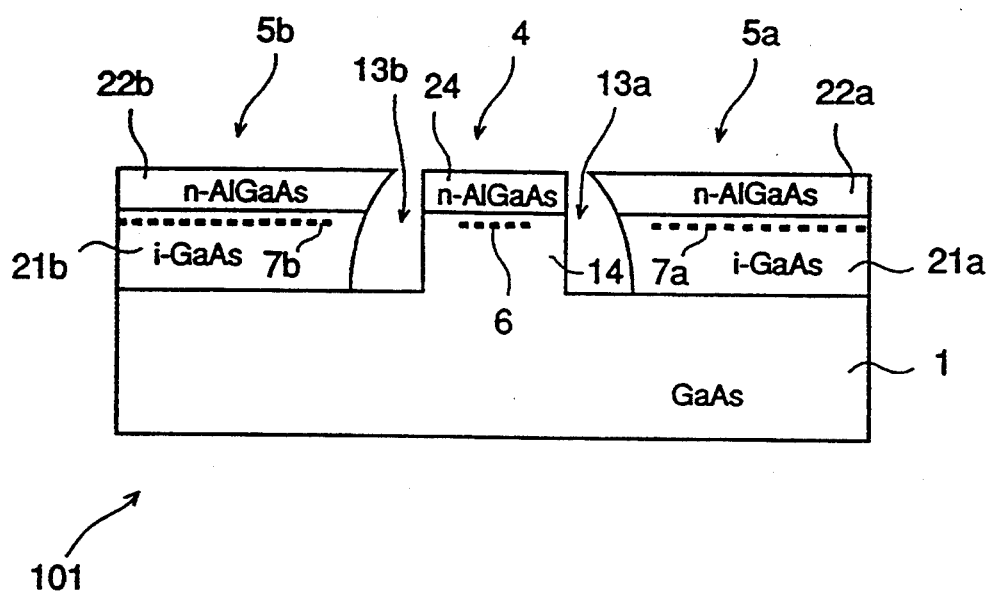
FIG. 1 is a diagram illustrating a structure of an IPG transistor produced by a production method of a transistor in accordance with a first embodiment of the present invention.

FIGS. 1 and 2 are schematic cross-sectional views for explaining a production method of an IPG transistor in accordance with a first embodiment of the present invention. FIG. 1 shows a cross-sectional structure of the IPG transistor produced by the production method and FIG. 2 shows cross-sectional structures of the IPG transistor in main process steps of the production method.

Figure 22A:
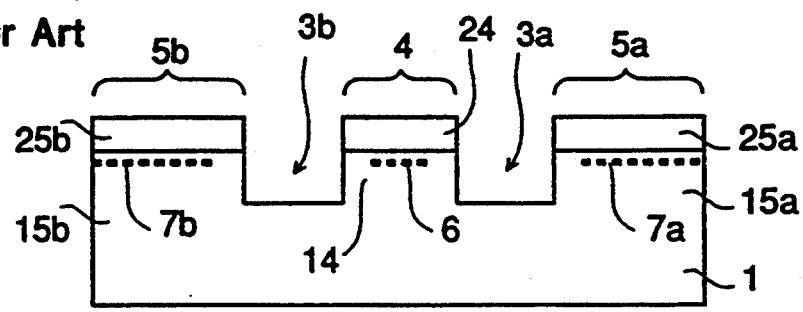
FIGS. 22a and 22b are diagrams for explaining a cross-sectional structure and a layout of source, drain, and gate portions of the prior art IPG transistor.
Figure 22B:
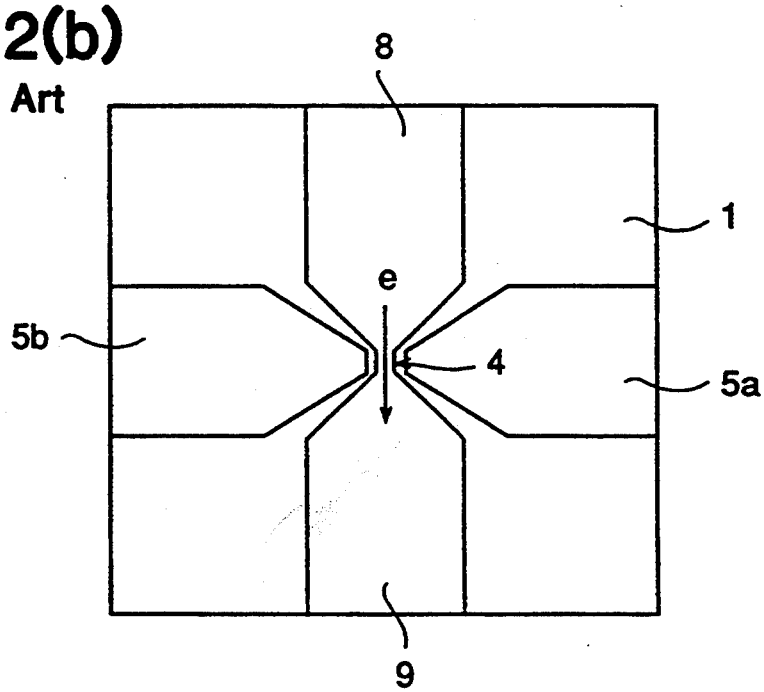

In the figures, the same reference numerals as those shown in FIGS. 22 and 24 designate the same elements as those in the prior art IPG transistor 200. Reference numeral 101 designates a D type IPG transistor having gap grooves 13a and 13b which are produced positioning between a channel portion 4 and gate portions 5a and 5b by utilizing side walls 12a and 12b produced self-aligningly on side wall surfaces of the channel portion 4.

In addition, i type GaAs gate layers 21a and 21b and n type AlGaAs gate layers 22a and 22b are produced at both sides of the channel portion 4 positioned by the side walls 12a and 12b with relative to the channel portion 4. 2DEG layers 7a and 7b are produced at portions of the i type GaAs gate layers 21a and 21b in the vicinity of their interfaces with the n type AlGaAs gate layers 22a and 22b, respectively. The other structure of this IPG transistor is the same as that of the prior art IPG transistor 200. For example, in the channel portion 4 a Q1D channel (a quasi-one-dimensional conductive channel) 6 which is a 2DEG layer spatially restricted, is produced at a portion of a GaAs channel layer 14 in the vicinity of its interface with an n type AlGaAs channel layer 24.

The production method will be described below.

Figure 23:
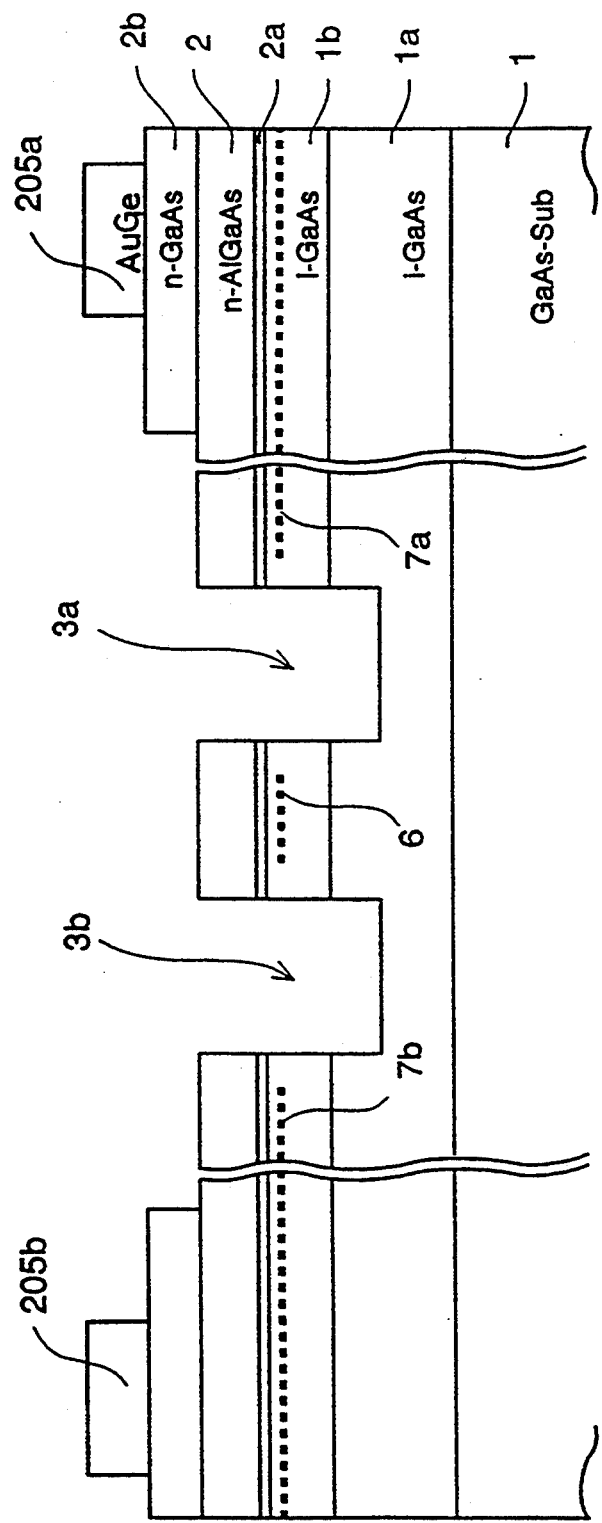
FIG. 23 is a diagram illustrating a semiconductor layer structure in detail of the prior art IPG transistor.
Figure 24A:
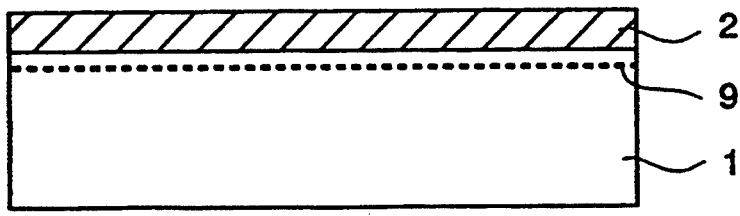
FIGS. 24a–24d are diagrams for explaining a production method of the IPG transistor in accordance with the prior art.
Figure 24B:
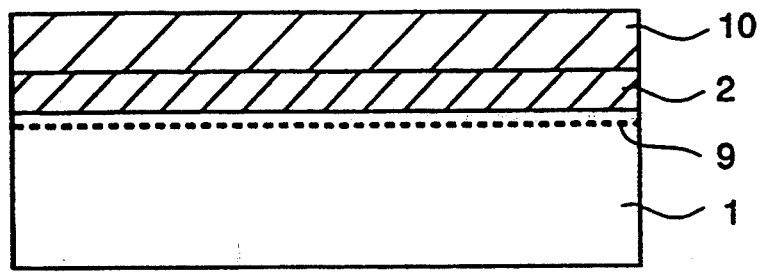
Figure 24C:
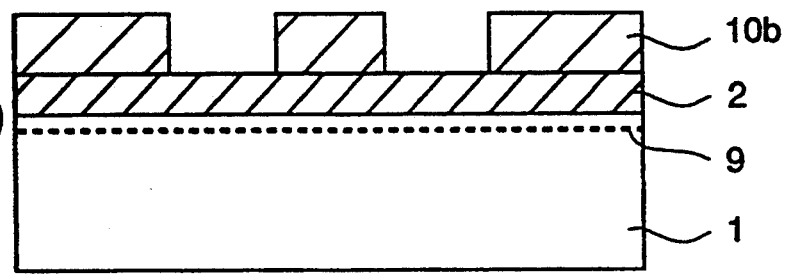
Figure 24D:
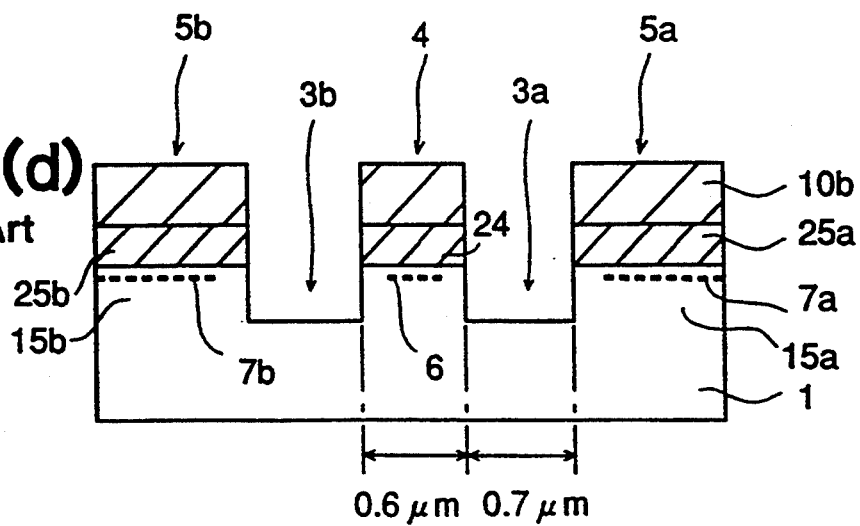
Figure 25A:
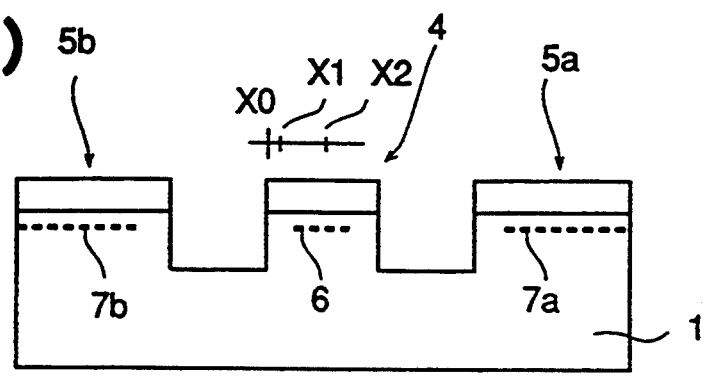
Figure 25B:
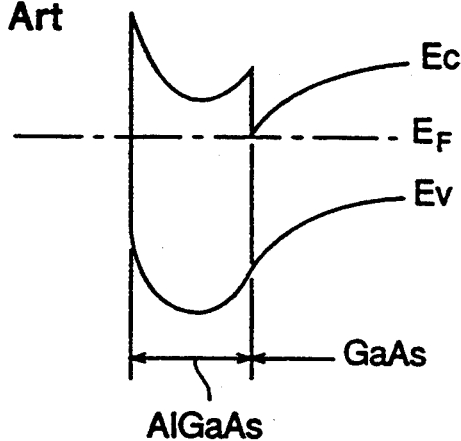
Figure 25C:
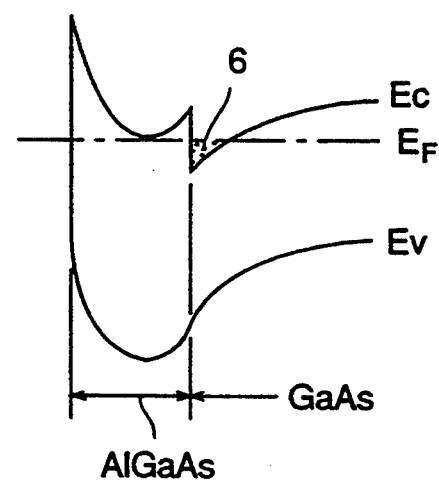
Figure 26A:
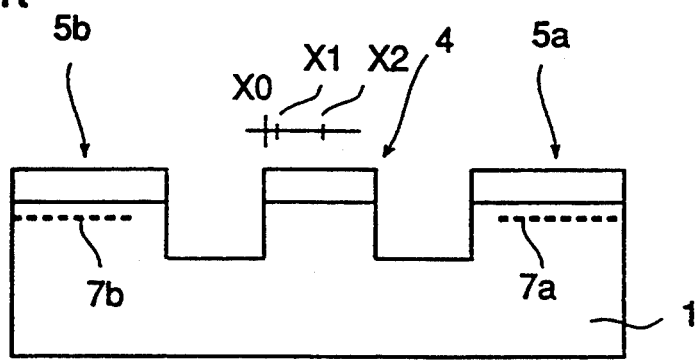
Figure 26B:
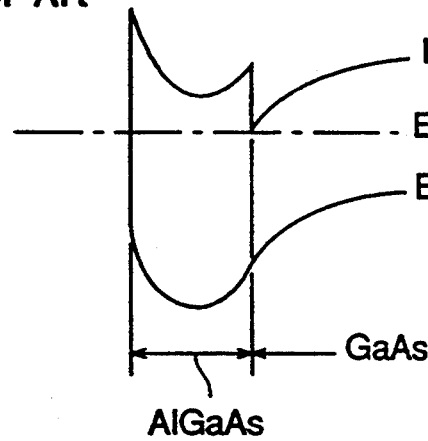
Figure 26C:
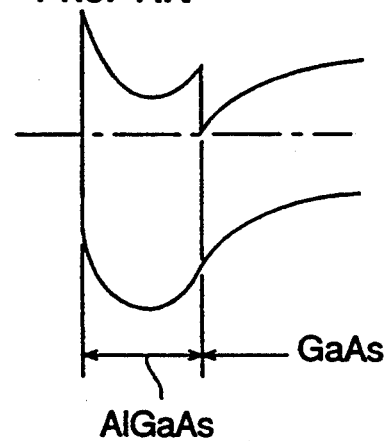

First of all, similarly in the prior art method, an n type AlGaAs layer 2 to which Si is doped at a high concentration is epitaxially grown on a semi-insulating GaAs substrate 1 (refer to FIG. 24(a)), and an insulating film, for example, an SiN film 11 is deposited on the n type AlGaAs layer 2 as shown in FIG. 2(a). The SiN film 11 may be thin but it is made about 0.1 μm thick here. In the actual production process, before producing the n type AlGaAs layer 2 on the semi-insulating GaAs substrate 1, an i type GaAs buffer layer 1a, an i type GaAs active layer 1b, and an i type AlGaAs layer 2a to which layers no impurity is doped are successively grown as shown in FIG. 23, but these semiconductor layers are not shown in FIG. 2(a) because these have no essential relation to the operation of the device.

Next, a photoresist film is applied on the entire surface, and is exposed and developed by the conventional photolithography technique, thereby producing a photoresist mask 10a having a mask pattern for producing the channel portion 4. Here, the minimum width of the mask pattern is about 0.5 μm, so that the electron beam exposure method is not required for the exposure of the photoresist film 10 and the conventional optical exposure method can be applied.

Thereafter, the SiN film 11 at the uppermost surface is etched by the conventional dry etching technique using the photoresist mask 10a as a mask, and the etching is carried out up to reaching at least the surface portion of the GaAs substrate 1. Thereby, the channel portion 4 comprising the GaAs channel layer 14 and the n type AlGaAs channel layer 24 disposed thereon is formed as shown in FIG. 2(b). Here, an etching gas including CF$_4$ and O$_2$ and the like is used for the etching of the SiN film 11, and a dry etching technique such as RIE employing an etching gas including chlorine series gas, for example, CCl$_2$F$_2$ or the like is used for the etching of the AlGaAs layer 2 and the GaAs substrate 1 because the side surfaces of the channel portion 4 are preferred to be vertical to the substrate surface. Further, the etching depth is not limited differently from the prior art production method and it can be set to a desired depth, for example, a deeper depth as 0.5 μm.

Subsequently, an insulating film, for example, an SiO$_2$ film 12 is deposited on the entire surface by the plasma CVD method as shown in FIG. 2(c). The thickness of this SiO$_2$ film 12 restricts the width of the side walls 12a and 12b produced in a later process, and its thickness is set to 0.5 μm here.

Next, anisotropic etching is carried out to the SiO$_2$ film 12 by, for example, RIE, thereby etching-back the SiO$_2$ film 12. Thereby, the SiO$_2$ film remains only on the side surfaces of the channel portion 4, thereby producing the side walls 12a and 12b as shown in FIG. 2(d). Then, the width of the side walls 12a and 12b is at largest about 0.4 μm.

Next, the GaAs layers 21a and 21b having the same composition as the GaAs channel layer 14 are grown only on the exposed portions of the GaAs substrate 1 employing an epitaxial growth method such as MOCVD (Metal Organic Chemical Vapor Deposition). Subsequently, the n type AlGaAs layers 22a and 22b having the same composition as the n type AlGaAs channel layer 24 are grown on the respective GaAs layers, thereby producing the gate portions 5a and 5b as shown in FIG. 2(e). In this state, the 2DEG layers 7a and 7b are produced at the interface portions of the GaAs gate layers 21a and 21b with the n type AlGaAs gate layers 22a and 22b, respectively.

In the epitaxial growth method, it is possible to make no crystal growth occur on the insulating film 11 by optimizing the conditions as shown in FIG. 2(e), and further, because the control of the growth speed is accomplished with quite high precision, it is easy to produce the GaAs gate layers 21a and 21b so that the 2DEG layers 7a and 7b produced in the gate portions 5a and 5b are positioned on the same plane as the quasi-one-dimensional conductive channel 6 in the channel portion 4.

In addition, the i type GaAs buffer layer 1a (although not shown in FIG. 2(a), refer to FIG. 23) is previously produced by the epitaxial growth on the exposed portion of the GaAs substrate 1. Such epitaxial growth to be carried out on a semiconductor layer to which an epitaxial growth is already done is generally called "regrowth", and a regrowth interface is likely to become a high resistance portion, resulting in a problem in a device structure in which a current is required to flow from the regrowth layer to its underlying already grown portion, as generally utilized in growing regrowth layers. In the IPG transistor 101 of this embodiment, however, the regrowth interface of a high resistance is preferable because it reduces the gate leakage current.

Finally, the side walls 12a and 12b are removed, thereby producing the gap grooves 13a and 13b between the channel portion 4 and the gate portions 5a and 5b. Thereafter, electrodes and the like are formed, completing the IPG transistor 101 as shown in FIG.

2(f). While the SiN film 11 remains here, this can be easily removed if required.

In the IPG transistor 101 thus produced, although the element structure is similar to that of the prior art IPG transistor 200, the production method of this embodiment enables to process the intervals between the channel portion 4 and the gate portions 5a and 5b to less than the width of the side walls 12a and 12b, that is, about 0.4 μm with high reproducibility as well as enables to easily process the gap grooves 13a and 13b to deeper than 0.5 μm. Further, the side walls 12a and 12b can be remained without removed depending on the a purpose, for example, in a case where importance is placed on reliability and the like of the element.

As described above, in this first embodiment, the channel portion 4 is produced by laminating the semiconductor layers on the GaAs substrate 1 and patterning the semiconductor layers, and thereafter the gate portions 5a and 5b are produced in close to the channel portion 4. Therefore, the gap grooves 13a and 13b having a high aspect ratio are produced between the channel portion 4 and the gate portions 5a and 5b without being restricted by the dry etching technique, resulting in the IPG transistor 101 having a high element performance.

Moreover, since the position determination of the gate portions 5a and 5b with relative to the channel portion 4 of the IPG transistor is performed by the side walls 12a and 12b which are self-aligningly produced on the side surfaces of the channel portion 4, photolithography process for producing the gate portions 5a and 5b is not required, and actually even including the photolithography process for producing the metal electrode after producing the gate portions 5a and 5b, only two photolithography processes are required to produce the IPG transistor.

In addition, because the gaps between the channel portion 4 and the gate portions 5a and 5b are regulated by the side walls 12a and 12b produced on the side surfaces of the channel portion 4, the gaps are made quite narrow, and the interval therebetween is controlled precisely with high reproducibility, whereby the high performance IPG transistor that has particularly improved the mutual conductance $g_m$ is stably obtained.

The production method of the IPG transistor in accordance with this embodiment is also applicable to a case where a plurality of the IPG transistors are integrated on the same wafer with the same effects as described above.

While in this embodiment, the heterojunction interface at the channel portion is AlGaAs/GaAs, it may be another combination of semiconductor layers, for example, AlGaAs/InGaAs, InAlAs/InGaAs, or the like. This point is also applicable to other embodiments of the present invention.

Embodiment 2

Figure 3A:
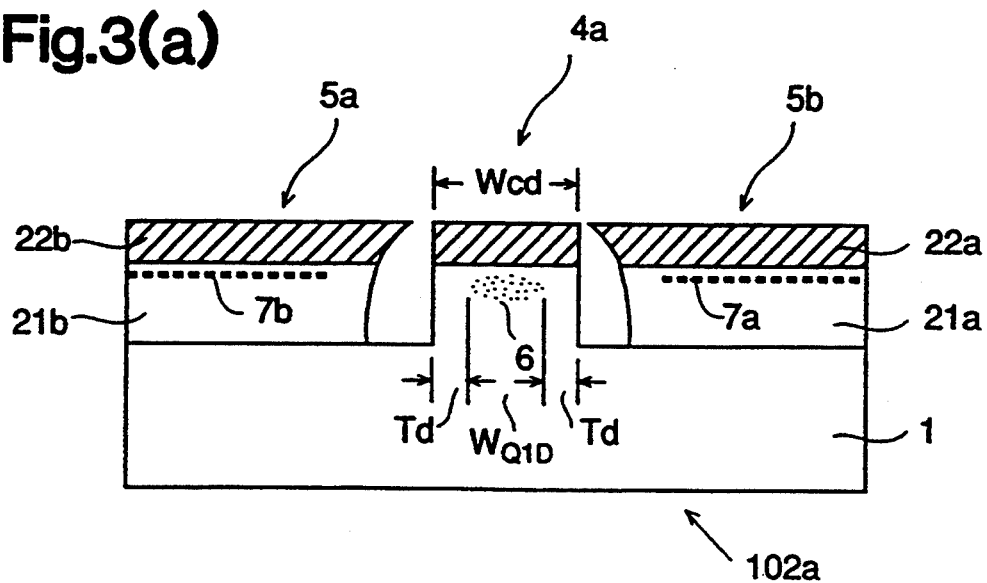
FIGS. 3a and 3b are diagrams illustrating a structure of an IPG transistor mounted on a semiconductor integrated circuit device in accordance with a second embodiment of the present invention.
Figure 3B:
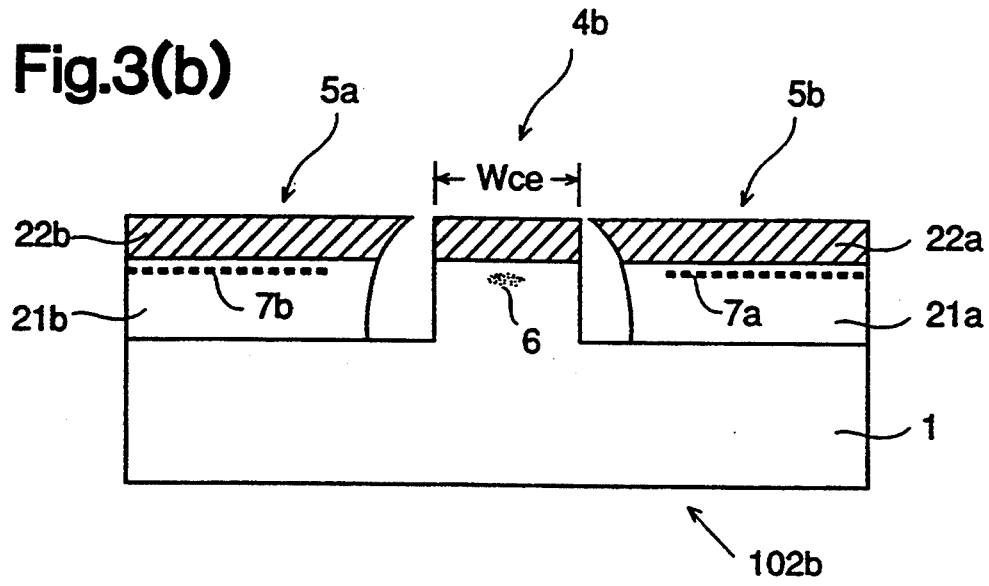

FIG. 3 is a diagram for explaining a structure of a semiconductor integrated circuit device in accordance with a second embodiment of the present invention, where FIG. 3(a) and FIG. 3(b) schematically show the cross-sectional structures of a D (depletion) type IPG transistor and an E (enhancement) type IPG transistor, respectively, which are mounted on the semiconductor integrated circuit device.

In the figures, the same reference numerals as those shown in FIG. 1 designate the same elements as those in the first embodiment. The D type IPG transistor 102a has a channel portion 4a of a width $W_{cd}$ which is adjusted so as to produce a quasi-one-dimensional conductive channel 6 in the channel portion 4a in a state where no gate voltage is applied to the gate portions 5a and 5b (gate voltage 0 V). The E type IPG transistor 102b has a channel portion 4b of a width $W_{ce}$ adjusted so as to forfeit the quasi-one-dimensional conductive channel 6 by the surface depletion layers at the side surface portions of the channel portion 4b in a state where no gate voltage is applied to the gate portions 5a and 5b. This semiconductor integrated circuit device mounts a logic circuit comprising a plurality of respective D and E type IPG transistors.

The width $W_{Q1D}$ of the quasi-one-dimensional conductive channel 6 is obtained by subtracting the thickness $T_d$ (about 0.2 μm) of the surface depletion layer extending from both side surfaces of the channel portion from the width $W_{cd}$ or $W_{ce}$ of the channel portion 4, and therefore when the thickness 2Td of the surface depletion layers at both side surfaces is less than the width of the channel portion, the IPG transistor is of D type, and when it is larger than that, it is of E type.

Figure 4A:
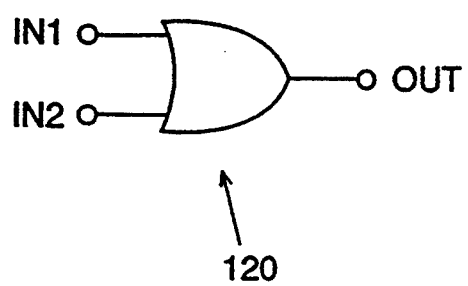
FIGS. 4a and 4b are diagrams illustrating an example of circuit construction of the semiconductor integrated circuit device in accordance with the second embodiment.
Figure 4B:
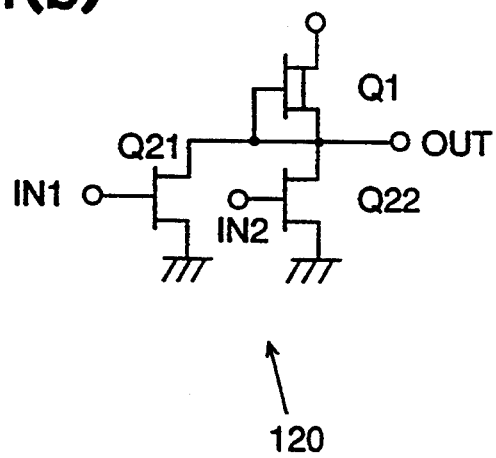

FIG. 4 shows an example of a logical circuit mounted on the above-described semiconductor integrated circuit device, where FIG. 4(a) shows its logical structure and FIG. 4(b) shows its concrete circuit structure. In the figures, a two input NOR circuit 120 of a DCFL (Direct Coupled FET Logic) circuit system has two input terminals $IN_1$ and $IN_2$, and comprises the D type IPG transistor Q1 connected between a power supply and an output terminal OUT and the E type IPG transistors Q21 and Q22 which are connected in parallel to each other between the output terminal OUT and the ground.

A description will be given of the functions and the effects below.

Usually, active elements having more than two kinds of threshold voltages are required for constituting a digital circuit. Here, the threshold voltage is a voltage level as a boundary between effecting cut off and conducting of a channel current for a voltage applied to a control terminal of the active element, for example, a gate. A circuit called as of an E/D type DCFL usually comprises an E mode element that produces no current flow at the gate voltage of 0 V and a D mode element that produces a current flow at the gate voltage of 0 V, and the threshold voltages of the E and D mode elements have a positive value and a negative value, respectively. Thus, it is essential for increasing the degree of freedom in the circuit design to produce active elements having different threshold voltages on the same substrate.

By the way, in the conventional MESFET, HEMT or the like, the setting of the threshold voltage is performed using the concentration of the semiconductor layer at the channel portion or the thickness of the semiconductor layer at the channel portion, therefore various devises are required during the production process in order to produce a plurality of elements having different threshold voltages on the same substrate.

For example, when setting the threshold voltages employing the concentration of the semiconductor layer at the channel portion, the concentration of impurity implanted into the channel portion is required to be changed between in the E type element formation region and in the D type element formation region, so that impurity implantation is required to be carried out into each region in a state where masks are disposed on the other regions. In this method, however, the impurity implantations are required to be carried out separately for respective type element formation regions, and then a mask layer is required to be produced in a mask formation process to cover the other type element region with its masking portions, resulting in an increase in the process number in the production process.

Figure 5A:
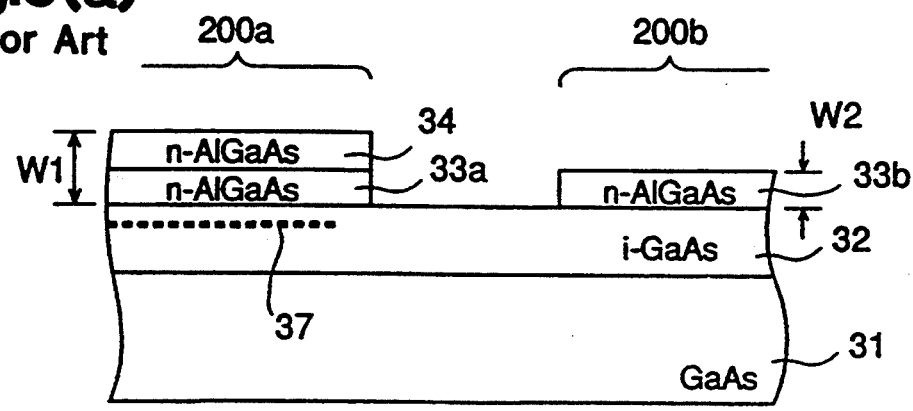
FIGS. 5a and 5b show schematic cross-sectional views for explaining a prior art production method of a semiconductor integrated circuit device that has produced HEMTs which have different threshold voltages on the same chip.

As a method for setting the threshold voltages employing the film thickness of the semiconductor layer at the channel portion, there is a method of adjusting the film thickness of the n type AlGaAs layer on the i type GaAs layer where the two-dimensional electron gas layer is produced as shown in FIG. 5(a). In this method, after an i type GaAs layer 32 and an n type AlGaAs layer of predetermined thicknesses are successively produced on a semi-insulating GaAs substrate 31, the n type AlGaAs layer is patterned, thereby producing n type AlGaAs layers 33a and 33b of the same thickness at D type and E type element formation regions 200a and 200b, respectively, and an n type AlGaAs layer 34 is further selectively produced on the n type AlGaAs layer 33a at the D type mode element formation region 200a.

Figure 6A:
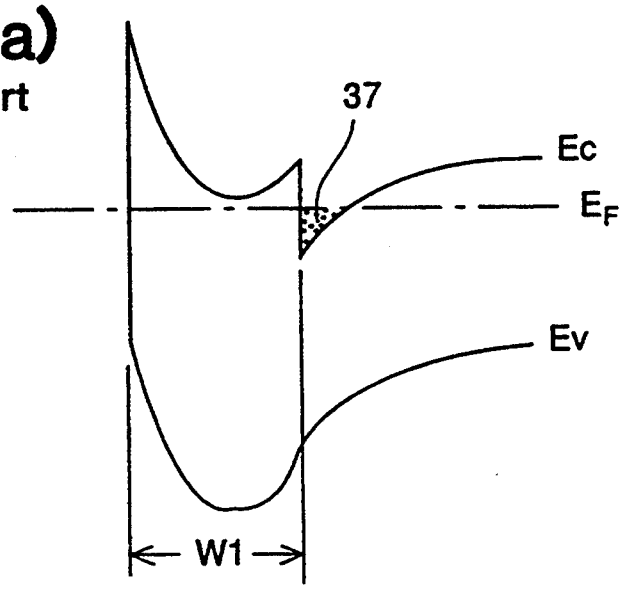
FIGS. 6a and 6b are diagrams illustrating band structures of the HEMTs having different threshold voltages.
Figure 6B:
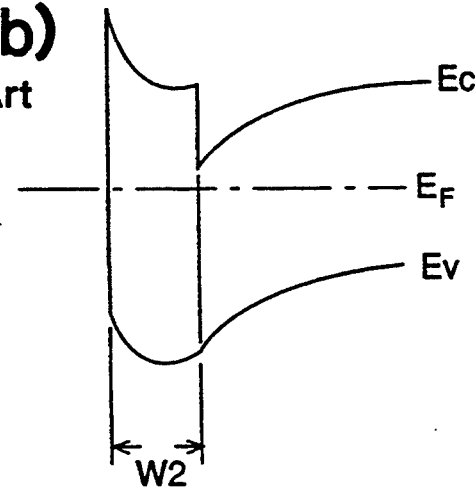

In this case, at the D type element formation region 200a, the layer thickness W1 of the n type AlGaAs layer is large as shown in FIG. 5(a), so that the band structure at this region becomes one where a two-dimensional electron gas layer 37 is produced at the interface portion of the i type GaAs layer 32 with the n type AlGaAs layer 33a as shown in FIG. 6(a), while at the E type element formation region 200b, the layer thickness W2 of the n type AlGaAs layer is small as shown in FIG. 5(a), so that the band structure at this region becomes one in which the potential level of electron at the i type GaAs layer 32 is floated up as shown in FIG. 6(b), and no two-dimensional electron gas layer is produced at the interface portion of the i type GaAs layer 32 with the n type AlGaAs layer 33b. Accordingly, the D type element and the E type element can be produced on the same substrate by changing the thickness of the AlGaAs layer.

Figure 5B:
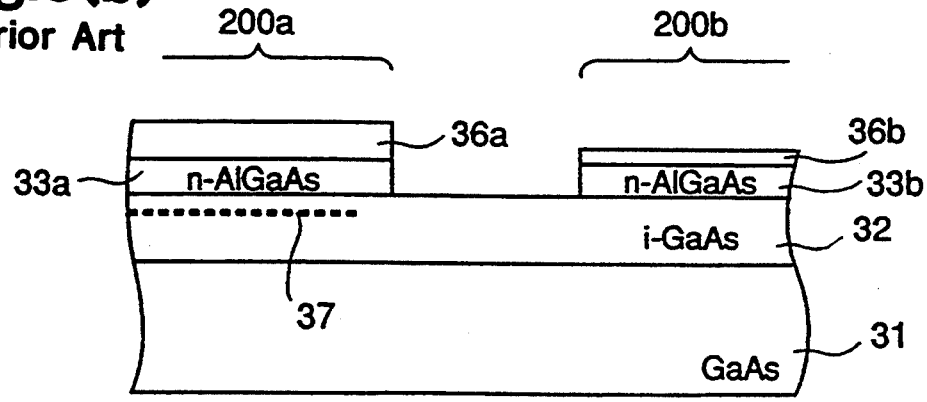

In addition, in place of adjusting the film thickness of the n type AlGaAs layer as shown in FIG. 5(a), a thick n type GaAs layer 36a may be produced on the n type AlGaAs layer at the D type element formation region 200a, and a thin n type GaAs layer 36b may be produced on the n type AlGaAs layer at the E type element formation region 200b as shown in FIG. 5(b).

However, also in this method of setting the threshold voltage by the film thickness of the semiconductor layers as shown in FIG. 5, it is required to carry out etching process selectively and to carry out epitaxial growth process selectively for the D type element formation region 200a and the E type element formation region 200b in order to change the thicknesses of the AlGaAs layer and the GaAs layer between these regions, so that processes of forming masks for carrying out these processes selectively are required, resulting in an increase in the process number in the production process.

On the other hand, the semiconductor integrated circuit device of this second embodiment employs the D type IPG transistor 102a having the threshold voltage established by the width of the channel portion 4a and the E type IPG transistor 102b having the threshold voltage established by the width of the channel portion 4b. Therefore, the IPG transistors having different threshold voltages are produced at the same time only by setting the dimension of the mask patterns which regulate the widths of the channel portions 4a and 4b appropriately at the respective transistor formation regions.

In more detail, as shown in FIG. 2(a), the n type AlgaAs layer 2 is epitaxially grown on the semi-insulating GaAs substrate 1, and the SiN film 11 is deposited thereon, and thereafter the photoresist film 10 is patterned so that the channel portion has a width that generates the quasi-one-dimensional conductive channel 6 in a state where the gate voltage is 0 V at the D type IPG transistor formation region, while the channel portion has a width that forfeits the quasi-one-dimensional conductive channel 6 by the surface depletion layers at the side surface portions of the channel portion in a state where the Gate voltage is 0 V at the E type IPG transistor formation region.

Thereafter, a prescribed process as shown in FIGS. 2(b) to 2(d) is carried out, whereby the semiconductor integrated circuit device mounting a plurality of D type IPG transistors and a plurality of E type IPG transistors is obtained.

In the production method of this second embodiment, neither selective process for each type IPG transistor formation region, nor formation of a mask for executing such a selective process are required, and a semiconductor integrated circuit device mounting a E/D type logical circuit is produced easily in a less number of process steps.

Embodiment 3

Figure 7:
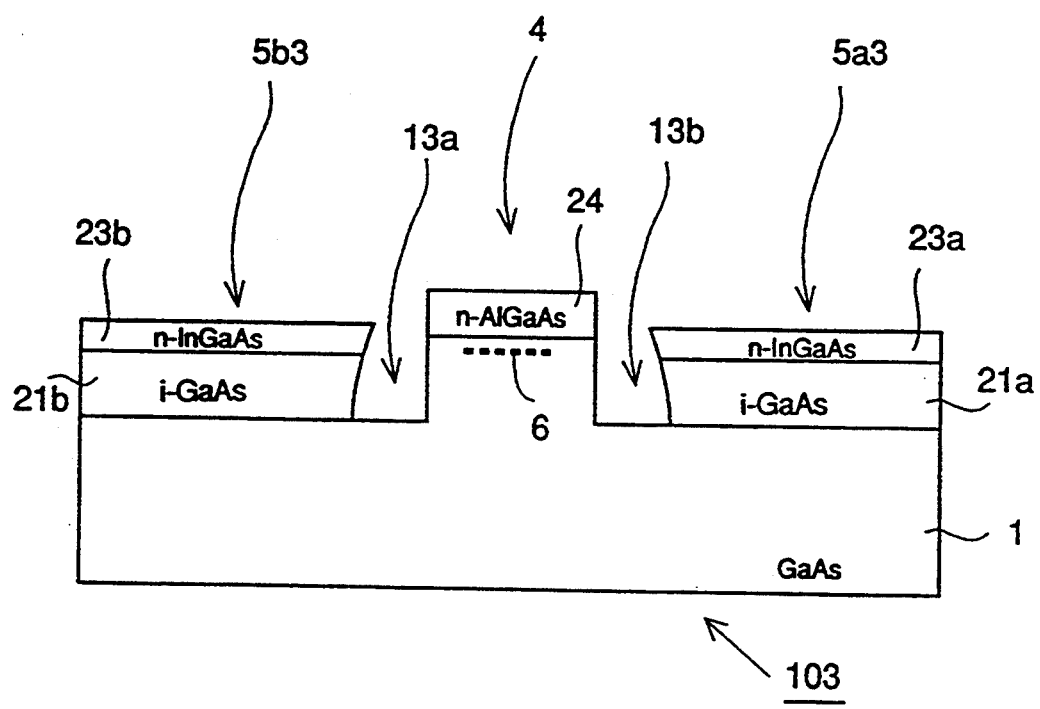
FIG. 7 is across-sectional view illustrating a structure of an IPG transistor in accordance with a third embodiment of the present invention.

FIG. 7 is a cross-sectional view illustrating a structure of an IPG transistor in accordance with a third embodiment of the present invention, and FIGS. 8(a) to 8(f) are schematic cross-sectional views for explaining a production method of the IPG transistor in the sequence of the process steps.

In the figures, in an IPG transistor 103 of this embodiment, gate portions 5a3 and 5b3 comprise i type GaAs gate layers 21a and 21b and low resistance n type InGaAs gate layers 23a and 23b which, produced on the i type gate layers 21a and 21b, control a quasi-one-dimensional conductive channel 6 in a channel portion 4. The other construction is the same as that of the IPG transistor 101 of the first embodiment shown in FIG. 1.

Here, the low resistance n type InGaAs gate layers 23a and 23b including Si as impurity to a concentration at an order of level of $10^{18}$ cm$^{-3}$ and having a thickness of 1000 Å (100 nm) are disposed so that upper surfaces thereof are positioned on the same plane as the quasi-one-dimensional conductive channel 6 at the channel portion 4.

The production method will be described below.

Similar to the production method of the IPG transistor of the first embodiment shown in FIG. 2, the channel portion 4 is produced and side walls 12a and 12b are produced at both sides of the channel portion as shown in FIGS. 8(a) to 8(d).

Figure 8:
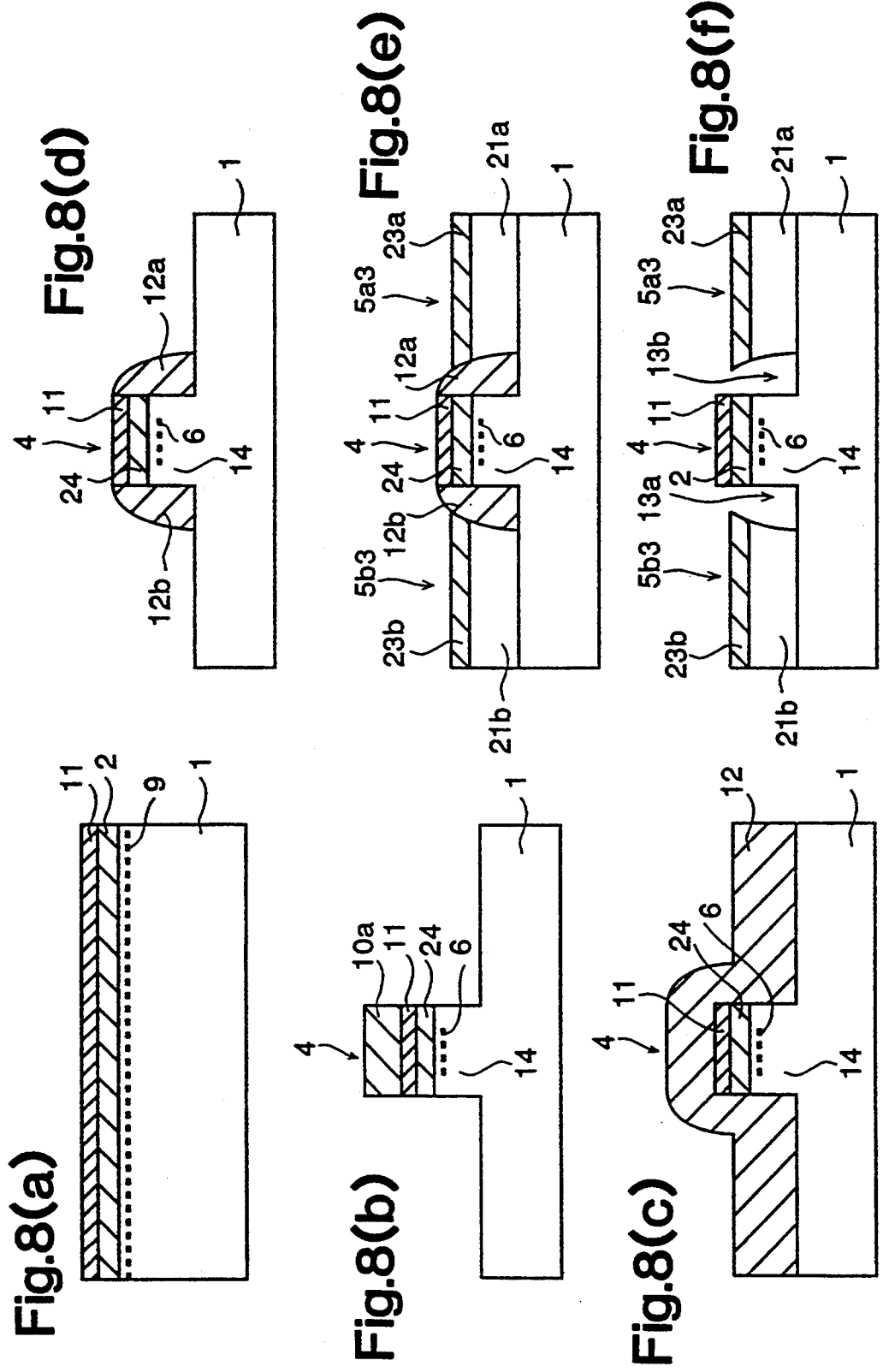
FIGS. 8a–8f are cross-sectional views for explaining a production method of the IPG transistor in accordance with the third embodiment.

Next, the i type GaAs layers 21a and 21b are grown to a prescribed thickness so that the height of the upper surfaces of the i type GaAs layers 21a and 21b does not exceed the height of the quasi-one-dimensional conductive channel 6 at the channel portion 4, on exposed portions of the GaAs substrate 1 by an epitaxial growth method such as MOCVD. Subsequently, InGaAs layers into which, for example, Si is doped at a high concentration of $3 \times 10^{19}$ cm$^{-2}$, are respectively grown to a prescribed thickness on the i type GaAs layers, thereby producing the low resistance n type InGaAs gate layers 23a and 23b confronting to the quasi-one-dimensional conductive channel 6 as shown in FIG. 8(e). Then, when the thickness of the InGaAs layers is set to, for example, 20 nm, the gate layers 23a and 23b of the sheet resistance of about 100 Ω are realized.

Here, although it is not shown here, it is possible to produce GaAs layers or the like successively on the n type InGaAs layers 23a and 23b in order to avoid the influences of the surface depletion layers. It is possible to make no crystal growth occur on the insulating film by optimizing the conditions by the known technique in this epitaxial growth method. In addition, because the growth speed can be controlled with quite high precision by the MOCVD method, it is easily possible to produce the low resistance n type InGaAs layers 23a and 23b so that their upper surfaces are positioned approximately on the same plane as the quasi-one-dimensional conductive channel 6.

Thereafter, similarly to the first embodiment, the side walls 12a and 12b are removed, thereby producing the gap grooves 13a and 13b between the channel portion 4 and the gate portions 5a3 and 5b3 as shown in FIG. 8(f), and formation of electrode and the like are carried out, thereby completing the IPG transistor 103.

As described above, in this embodiment, the gate layers 23a and 23b controlling generation and forfeiture of the quasi-one-dimensional conductive channel 6 in the channel portion 4 comprise the low resistance semiconductor thin film into which impurity is introduced at a high concentration, so that parasitic resistance of the gate electrode is reduced, whereby the high Speed performance of the IPG transistor is brought out to the maximum.

Embodiment 4

Figure 9:
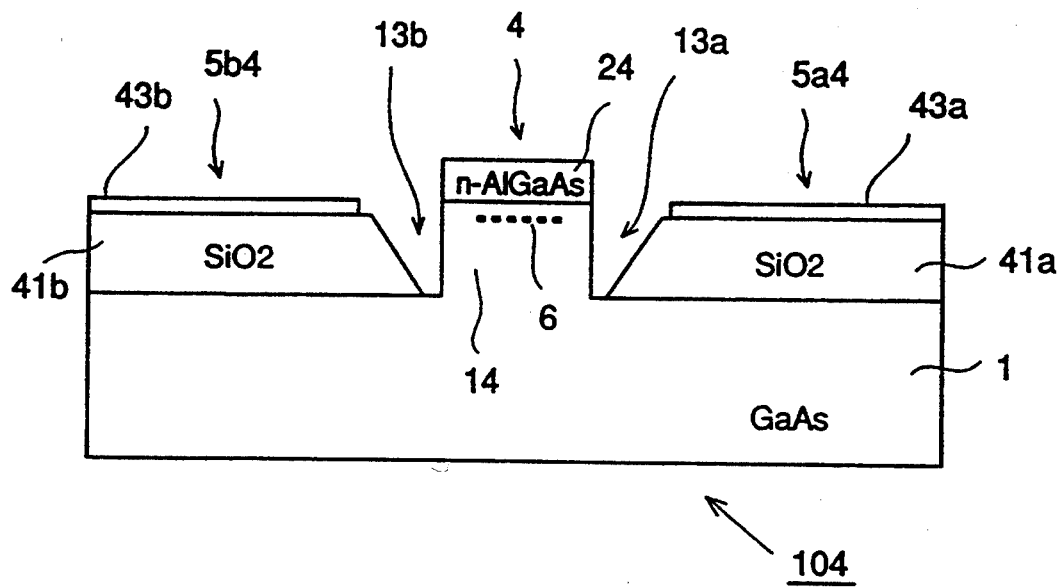
FIG. 9 is a cross-sectional view illustrating a structure of an IPG transistor in accordance with a fourth embodiment of the present invention.

FIG. 9 is a cross-sectional view illustrating a structure of an IPG transistor in accordance with a fourth embodiment of the present invention, and FIGS. 10(a) to 10(h) are cross-sectional views for explaining a production method of the IPG transistor.

In the figures, in an IPG transistor 104 of this embodiment, gate portions 5a4 and 5b4 respectively comprise SiO₂ layers 41a and 41b and low resistance metal gate layers 43a and 43b produced on the gate layers 41a and 41b. The other construction is the same as that of the IPG transistor 101 of the first embodiment shown in FIG. 1.

Here, each of the low resistance metal gate layers 43a and 43b comprises an Au layer of 20 nm thickness which is produced by an anisotropic deposition method such as a vacuum evaporation method, and the SiO₂ layers 41a and 41b of about 0.5 μm thickness are produced so that the low resistance metal gate layer 43a and 43b thereon are confront the quasi-one-dimensional conductive channel 6 in the channel portion 4.

The production method will be described below.

First of all, similarly to the first embodiment, an n type AlGaAs layer 2 is produced on a GaAs substrate 1, and an SiN film 11 is deposited thereon in a thickness of, for example, about 0.2 μm as shown in FIG. 10(a).

Next, a photoresist mask 10a for producing the channel portion is produced by the usual photolithography technique. Then, supposing that a pattern width of the photoresist mask 10a is set to about 0.7 μm, an electron beam exposure method is not necessarily required and the usual optical exposure method is applicable. Thereafter, the SiN film 11 is etched using the photoresist mask 10a as a mask by the usual dry etching technique so as to have the same dimension as that of the mask pattern 10a, and successively the etching process is carried out at least up to reaching the GaAs substrate 1, thereby producing an n type AlGaAs channel layer 24 and an i type GaAs channel layer 14. In this case, because it is desirable that side walls of the channel portion 4 become perpendicular, the dry etching technique such as RIE using chlorine series gas is adopted. Further, the channel layers 14 and 24 are side-etched, for example, by 0.1 μm at their both side ends, so as to become thinner than the pattern width of the photoresist mask 10a for the sake of the later process as shown in FIG. 10(b).

Thereafter, the photoresist mask 10a is removed, and an insulating film, for example, an SiO₂ film 41 is deposited on the entire surface as shown in FIG. 10(c). Then, the SiO₂ film 41 disposed has a thickness that the upper surface of the SiO₂ film 41 at both sides of the channel portion 4 on the GaAs substrate 1 reaches almost the same height as that of the quasi-one-dimensional conductive channel 6, i.e., 0.5 μm. Besides, at this time, because the width of the SiN film 11 is larger than that of the channel layers 14 and 24, portions of the SiO₂ film 41 on both side surfaces of the channel portion 4 have a overhanging configuration as shown in the figure.

Subsequently, a metal thin film 43 of a low resistivity such as gold is deposited employing a depositing method of strong directionality, for example, the vacuum evaporation method as shown in FIG. 10(d). Then, the metal thin film is not deposited on the side surfaces of the SiO₂ film 41 on both side surfaces of the channel portion 4 because of the overhanging configuration of the SiO₂ film, and the low resistance metal gate layers 43a and 43b are produced at both sides of the channel portion 4. Then, the thickness of the metal thin film is set to approximately 20 nm, a sheet resistance of the film is approximately several Ω, resulting in great contribution to reduction in the gate resistance.

Next, a photoresist film 48 is applied on the entire surface as shown in FIG. 10(e), and the photoresist film 48 is etched back up to exposing the upper portion of the SiO₂ film 41 on both side surfaces of the channel portion 4, thereby producing photoresist mask 48a and 48b at both sides of the channel portion 4 as shown in FIG. 10(f).

Thereafter, when the SiO₂ film 41 is exposed to a liquid which the SiO₂ film 41 can be dissolved and removed with, for example, hydrofluoric acid in aqueous solution, the SiO₂ film 41 is etched from its exposed side surfaces on both side surfaces of the channel portion 4, and at the same time, the low resistance metal thin film 43 above the channel portion 4 is lifted-off by removing the SiO₂ film 41 as shown in FIG. 10(g). Here, the SiN film 11 is removed if necessary.

At last, the photoresist masks 48a and 48b are removed with organic solvent or the like, thereby completing the IPG transistor 104 as shown in FIG. 10(h).

As described above, in this embodiment, because the gate layers 43a and 43b controlling generation and forfeiture of the quasi-one-dimensional conductive channel 6 in the channel portion 4 comprise a low resistance metal layer of Au, the parasitic resistance of the gate electrode is reduced as in the third embodiment, whereby the IPG transistor 104 from which high speed performance can be brought out to the maximum is obtained.

In addition, the photoresist masks 48a and 48b for producing the gate portions 5a4 and 5b4 are produced self-aligningly with the low resistance thin layer 43 by etching back the photoresist film 48, which is produced on the entire surface, so as to expose the side portions 41a and 41b of the SiO₂ film 41 at both side surfaces of the channel portion 4, therefore, the intervals between the gate portions 5a4 and 5b4 and the channel portion 4 are reduced.

An Alternative of Embodiment 4

Figure 11:
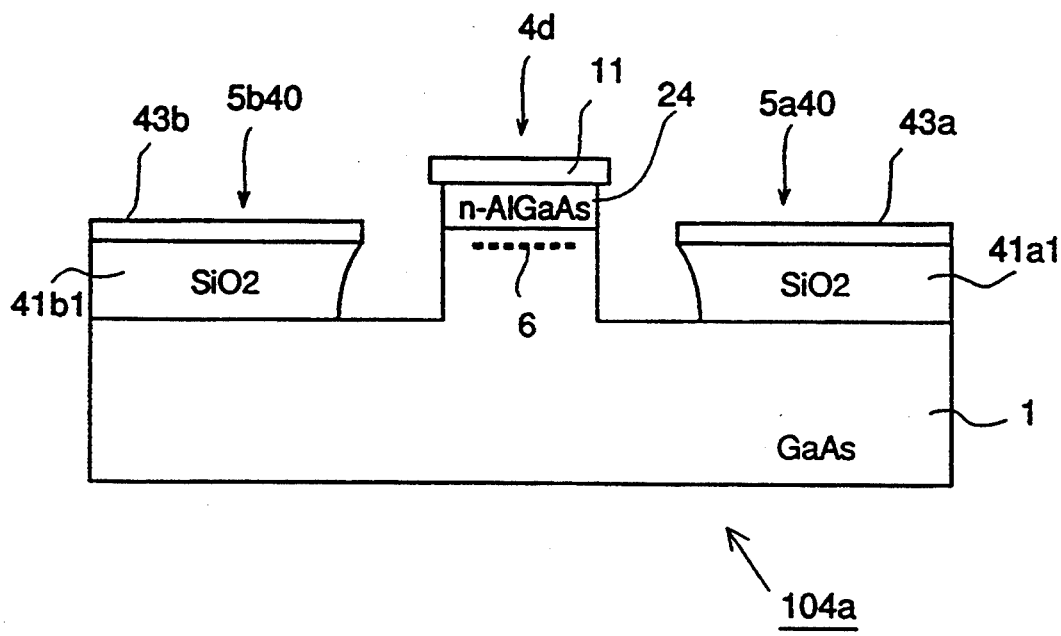
FIG. 11 is a cross-sectional view illustrating a structure of an IPG transistor in accordance with an alternative of the fourth embodiment.
Figure 12A:
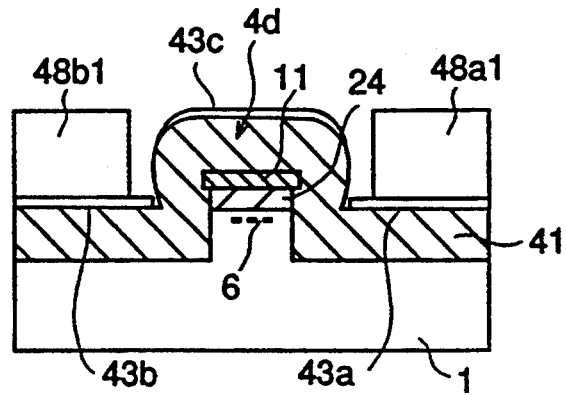
FIGS. 12a–12c are cross-sectional views for explaining a production method of the IPG transistor in accordance with the alternative of the fourth embodiment.
Figure 12B:
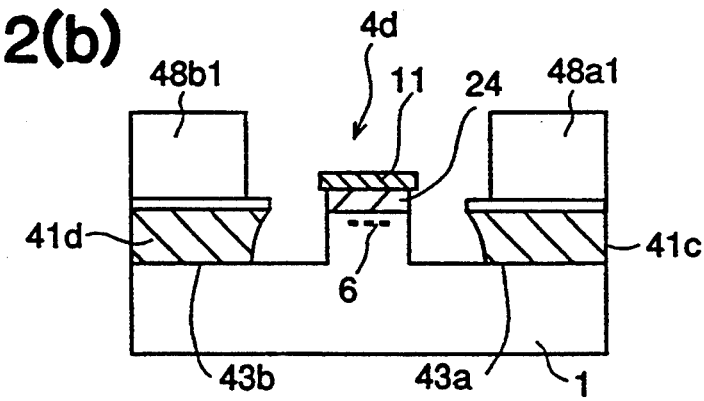
Figure 12C:
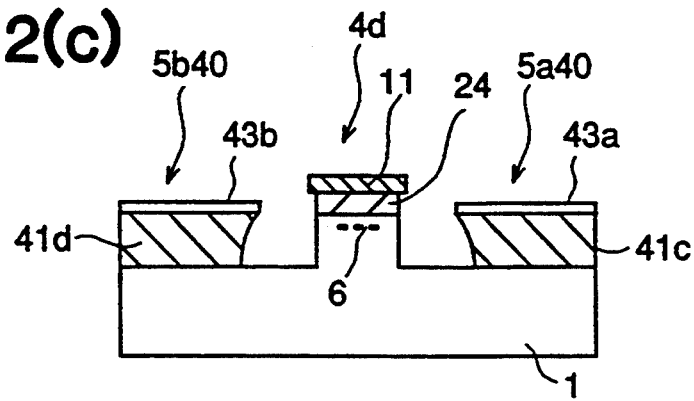

FIG. 11 is a cross-sectional view illustrating a structure of an IPG transistor in accordance with an alternative of the fourth embodiment, and FIGS. 12(a) to 12(c) are cross-sectional views for explaining a production method of the IPG transistor.

In the figure, in an IPG transistor 104a of this alternative, SiO₂ layers 41a1 and 41b1 included in gate portions 5a40 and 5b40 are patterned using a photoresist mask produced by usual photolithography, and the other structure is the same as that in the fourth embodiment.

The production method will be described shortly below.

Similarly to the fourth embodiment shown in FIGS. 10(a) to 10(d), channel portion 4d is produced on a GaAs substrate 1, and an SiO₂ film 41 and metal thin films 43a to 43c are produced, thereafter, photoresist masks 48a1 and 48b1 are produced by the usual registration method in the photolithography as shown in FIG. 12(a), and the SiO₂ film 41 is selectively etched using the photoresist masks, thereby producing the gate portions 5a40 and 5b40 as shown in FIGS. 12(b) and 12(c).

Embodiment 5

Figure 13:
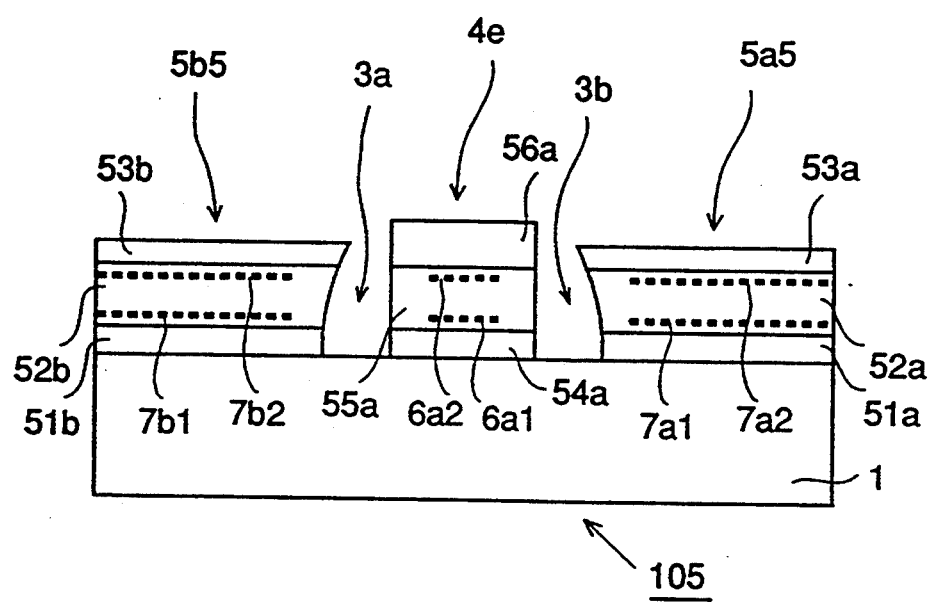
FIG. 13 is a cross-sectional view illustrating a structure of an IPG transistor in accordance with a fifth embodiment of the present invention.

FIG. 13 is a cross-sectional view illustrating a structure of an IPG transistor of a fifth embodiment of the present invention, and FIG. 14 is a cross-sectional view for explaining a production method of the IPG transistor.

In the figures, in an IPG transistor 105 of this embodiment, a channel portion 4e has a construction that quasi-one-dimensional conductive channels 6a1 and 6a2 electrically connecting between the source and drain regions are generated, and gate portions 5a5 and 5b5 respectively include first two-dimensional electron gas layers 7a1 and 7b1 which are produced corresponding to the quasi-one-dimensional conductive channel 6a1 and the gate portions include second two-dimensional electron gas layers 7a2 and 7b2 which are produced corresponding to the quasi-one-dimensional conductive channel 6a2.

The production method will be described below.

First, a first n type AlGaAs layer 54 of 0.1 μm thickness, an i type GaAs layer 55 of approximately 0.2 μm thickness, and a second n type AlGaAs layer 56 of approximately 0.1 μm thickness are successively produced on a GaAs substrate 1, and an SiN film 11 are produced thereon as shown in FIG. 14(a). Then, first and second two-dimensional electron gas layers 9a1 and 9a2 are produced at portions of the i type GaAs layer 55 in the vicinity of its upper and lower surfaces.

Next, a photoresist mask 10a for producing the channel portion is produced at a prescribed portion on the SiN film 11, and the SiN film 11 and the underlying semiconductor layers 54 to 56 are etched using the photoresist mask as a mask similarly to the first embodiment, thereby producing first and second n type AlGaAs layers 54a and 56a and an i type GaAs layer 55a as shown in FIG. 14(b).

After the photoresist mask 10a is removed, an SiO₂ film 12 is produced on the entire surface as shown in FIG. 14(c). Successively, the SiO₂ film 12 is etched back, thereby producing side walls 12a and 12b on side surfaces of the channel portion 4e as shown in FIG. 14(d).

Thereafter, first n type AlGaAs gate layers 51a and 51b, i type GaAs gate layers 52a and 52b, and second n type AlGaAs gate layers 53a and 53b are successively grown by an epitaxial growth method such as MOCVD on exposed surfaces of the GaAs substrate 1 so as to have the same thicknesses as their respectively corresponding semiconductor layers 54, 55, and 56 at the channel portion 4e, thereby producing the gate portions 5a5 and 5b5 as shown in FIG. 14(e). Then, the first two-dimensional electron gas layers 7a1 and 7b1 and the second two-dimensional electron gas layers 7a2 and 7b2 which respectively confront the first and second quasi-one-dimensional conductive channels 6a1 and 6a2 are respectively produced in the i type GaAs gate layers 52a and 52b in the vicinity of the upper and lower surfaces of the gate layers 52a and 52b.

At last, the side walls 12a and 12b and the SiN film 11 are removed if necessary, thereby completing the IPG transistor 105 as shown in FIG. 14(f).

As described above, in this embodiment, because the channel portion 4e of the IPG transistor has the structure that the two quasi-one-dimensional conductive channels 6a1 and 6a2 electrically connecting between the source and drain regions are generated, the number of quasi-one-dimensional conductive channel in the channel portion can be increased without enlarging the planar dimension of the transistor with a result that a controllable current value is doubled as compared with a transistor including one quasi-one-dimensional conductive channel in a channel portion.

Here, the IPG transistor described in this embodiment includes the channel portion which is structured so that the two quasi-one-dimensional conductive channels 6a1 and 6a2 are generated in the channel portion and the gate portions 5a5 and 5b5 each of which has the two two-dimensional electron gas layers, however, the number of the quasi-one-dimensional conductive channel in the channel portion and the number of the two-dimensional electron gas layer in the gate portion can be increased to three or more with a result that a controllable current value is increased in accordance with the increase in the number of the quasi-one-dimensional conductive channel.

In addition, the gate layer is not restricted to the two-dimensional electron gas layer, and it may be a low resistance semiconductor layer or a metal film as described in the third and fourth embodiments with a result that the same structure as that of this fifth embodiment is realized. In this case, it is also possible that one gate layer corresponding to each the quasi-one-dimensional conductive channel is produced in each the gate portion.

Embodiment 6

Figure 15A:
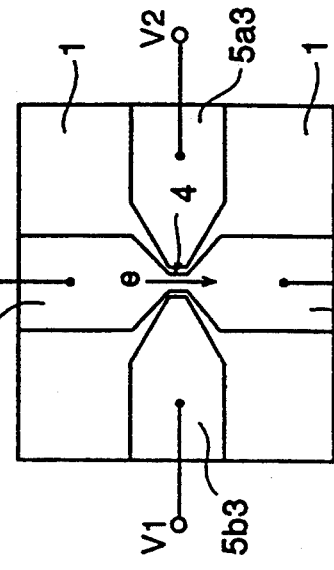
FIGS. 15a–15f are diagrams for explaining an IPG transistor in accordance with a six embodiment of the present invention.
Figure 15B:
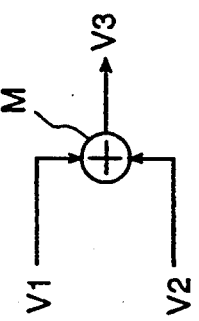
Figure 15C:
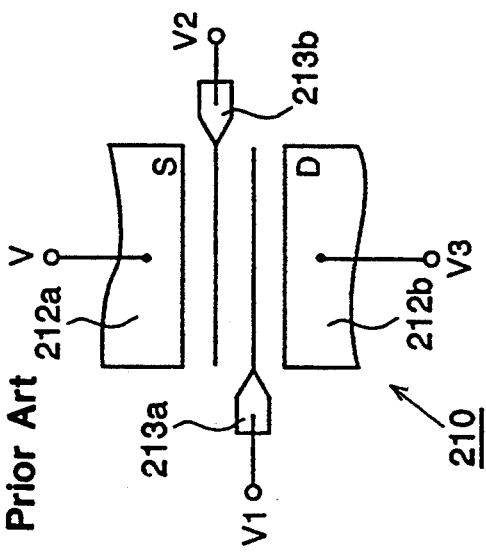
Figure 15D:
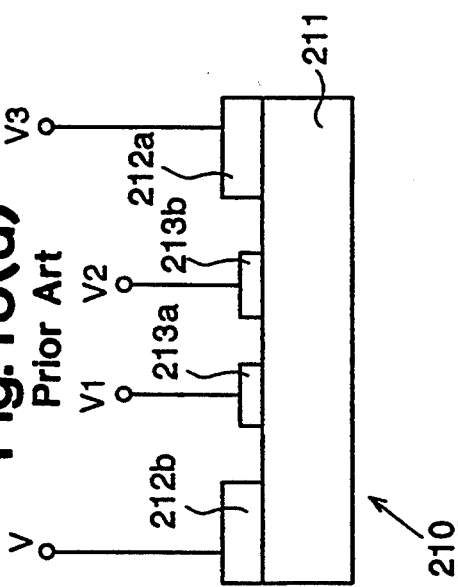
Figure 15E:
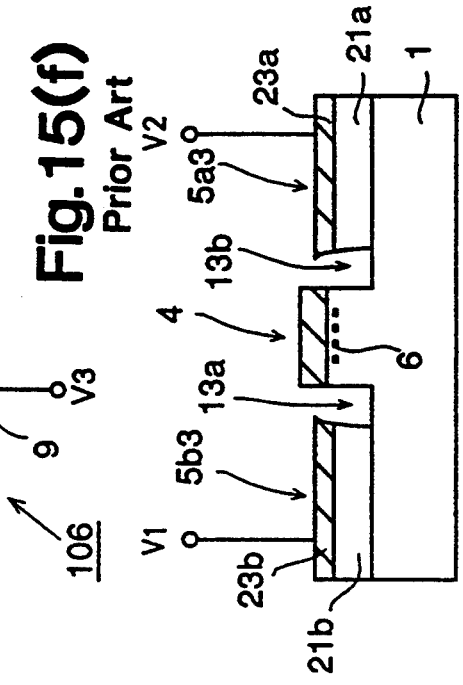
Figure 15F:
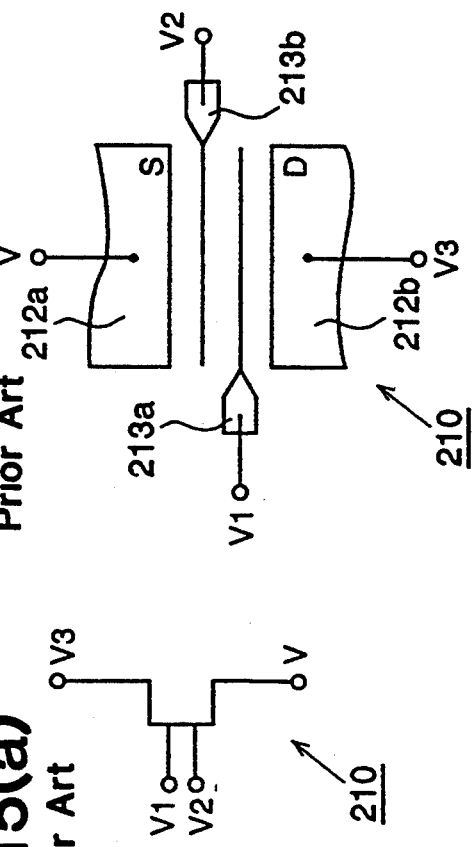

FIG. 15 is a view for explaining an IPG transistor in accordance with a sixth embodiment of the present invention, where FIG. 15(a) is a view illustrating a circuit structure of a mixer comprising a field effect transistor, FIG. 15(b) is a schematic view for explaining a signal process at the mixer, FIGS. 15(c) and 15(d) are a plan view and a cross-sectional view illustrating a structure of a usual dual gate FET included in the mixer, and FIGS. 15(e) and 15(f) are a plan view and a cross-sectional view illustrating a structure of the IPG transistor included in the mixer.

In the figures, an IPG transistor 106 of this embodiment is used as a mixer M which mixes first and second input signals V1 and V2 having different frequencies and outputs an output signal V3 of the other frequency.

In other words, in an element structure of the IPG transistor 106 which is the same as that of the third embodiment, the second and first input signals V2 and V1 are respectively input to low resistance n type AlGaAs gate layers 23a and 23b at respective gate portions 5a3 and 5b3 which are positioned at both sides of a channel portion 4, a prescribed voltage V is applied to a source 8, and the output signal V3 is output to a drain 9.

The functions and effects will be described below.

In a conventional dual gate FET 210, first and second gate electrodes 213a and 213b are disposed between a source 212a and a drain 212b which are disposed on a substrate 211 as shown in FIGS. 15(c) and 15(d), and when the prescribed voltage V is applied to the source 212a and the two input signals V1 and V2 having different frequencies from each other are respectively applied to the two gates, the third signal V3 is output to the drain 212b, realizing the mixer M.

However, when the mixer comprises the dual gate FET 210 having the above-described structure, signal leakage between the two gates 213a and 213b disposed adjacently on the same plane is likely to arise, so that a mixer of favorable characteristic is not obtained.

On the other hand, in the mixer 106 comprising the IPG transistor of this embodiment, because the two gate layers 23a and 23b as gate electrodes are electrically and magnetically isolated from each other by a channel portion 4 and gaps 13a and 13b which are placed at both sides of the channel portion 4, the signal leakage between input terminals is unlikely to arise as compared with the conventional dual gate FET 210, whereby the favorable characteristic is realized.

Embodiment 7

Figure 16A:
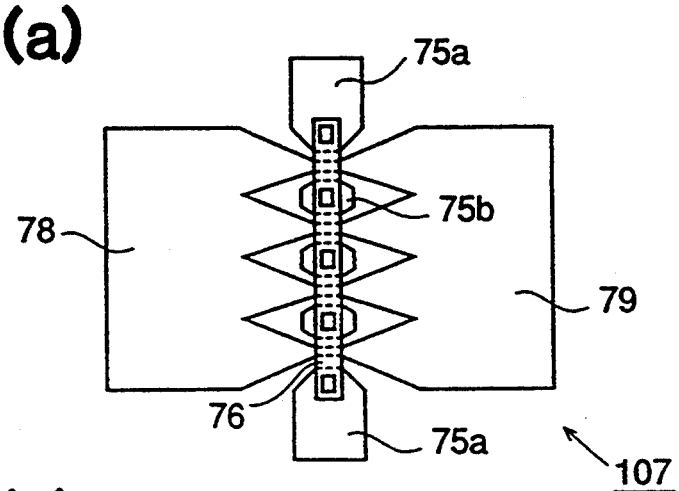
FIGS. 16a and 16b are diagrams for explaining a structure of an IPG transistor IC in accordance with a seventh embodiment of the present invention.
Figure 16B:
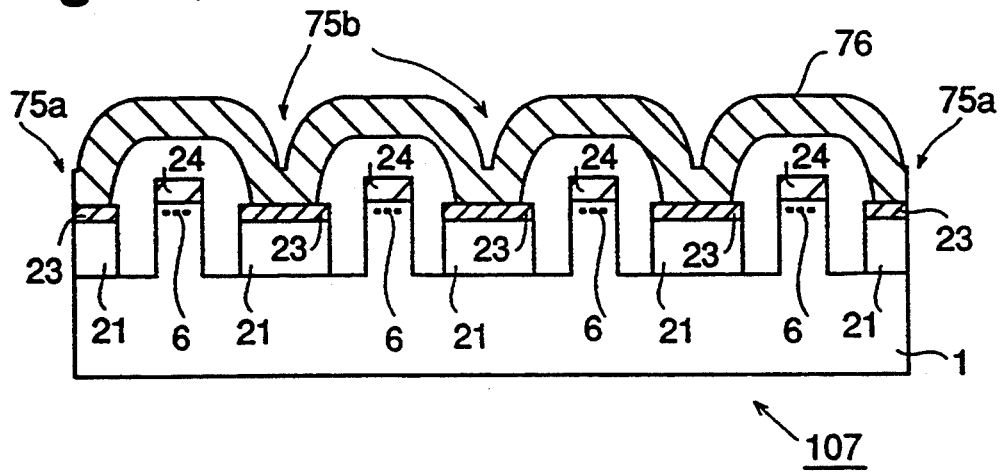

FIG. 16 is a view for explaining a structure of an IPG transistor IC of a seventh embodiment of the present invention, where FIG. 16(a) is a plan view and FIG. 16(b) is a cross-sectional view.

In the figure, an IPG transistor IC 107 includes a plurality of the IPG transistors 103 having the structure of the third embodiment which are connected in parallel with each other and mounted multi-monolithically on a GaAs substrate 1.

In this embodiment, a plurality of the gate portions having the structure which is shown in FIG. 7 are disposed in a line with prescribed intervals, and the channel portions shown in FIG. 7 are disposed between the adjacent gate portions. Gate portions 75a are ones which are positioned at the both ends of the linearly disposed gate portions, and intermediate gate portions 75b are ones which are positioned between the both end gate portions 75a. Each the gate portion 75a and 75b comprises a low resistance n type InGaAs gate layer 23 and an i type GaAs gate layer 21, and each the channel portion comprises an n type AlGaAs channel layer 24. Each the channel portion has a quasi-one-dimensional conductive channel 6 electrically connecting between a source 78 and a drain 79.

The low resistance n type AlGaAs gate layers 23 at the respective gate portions 75a and 75b are connected by an air bridge wiring 76.

Here, each the IPG transistor can be produced by every production method of the above-described embodiments.

As described above, according to this embodiment, a plurality of the IPG transistors are multi-monolithically mounted on the GaAs substrate 1, and the low resistance n type AlGaAs Gate layers 23 of the respective transistors are connected with each other by the air bridge wiring 76, therefore a large number of the IPG transistors are integrated, enabling to handle a large current. In addition, because a wiring having the same voltage as the gate layer 23 is used as the air bridge wiring 76, a parasic capacitance between the Gate layer and the quasi-one-dimensional conductive channel 6 is reduced although it is a problem at the high speed operation, so that the favorable characteristic is held.

Embodiment 8

Figure 17A:
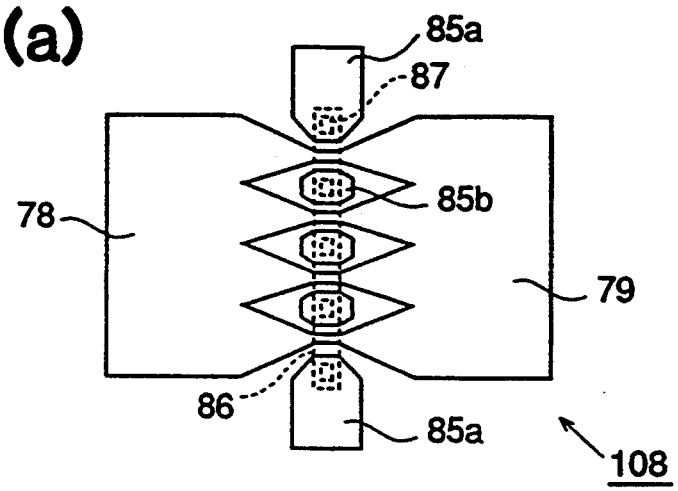
FIGS. 17a and 17b are diagrams for ex a structure of an IPG transistor IC in accordance with eighth embodiment of the present invention.
Figure 17B:
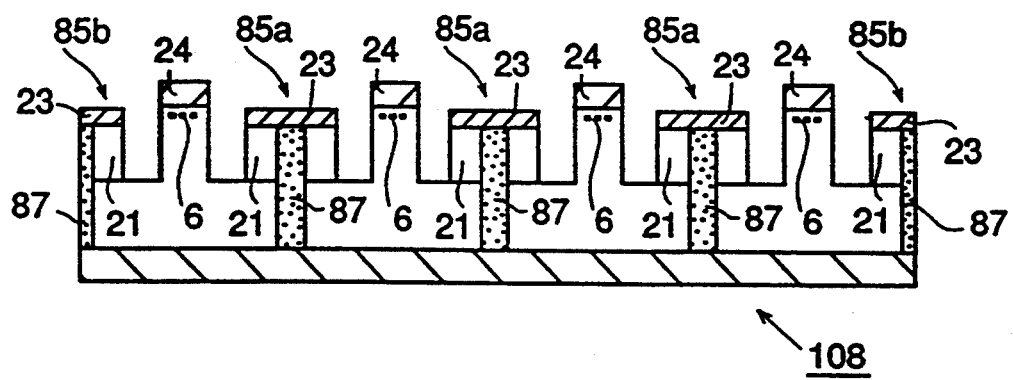

FIG. 17 is a view for explaining a structure of an IPG transistor IC in accordance with an eighth embodiment of the present invention, where FIG. 17(a) is a plan view and FIG. 17(b) is a cross-sectional view.

In the figure, an IPG transistor IC 108 of this embodiment comprises a rear surface wiring metal 86 which is produced on a rear surface of a substrate 1 in place of the air bridge wiring 76 in the IPG transistor IC of the seventh embodiment, and which is connected to gate layers 23 through contact holes 87 produced in the substrate 1, distinguishing this embodiment from the seventh embodiment. Gate portions 85a and 85b respectively correspond to the gate portions 75a and 75b shown in FIG. 16.

In this embodiment, the same effects as those in the seventh embodiment are obtained.

Embodiment 9

Figure 18A:
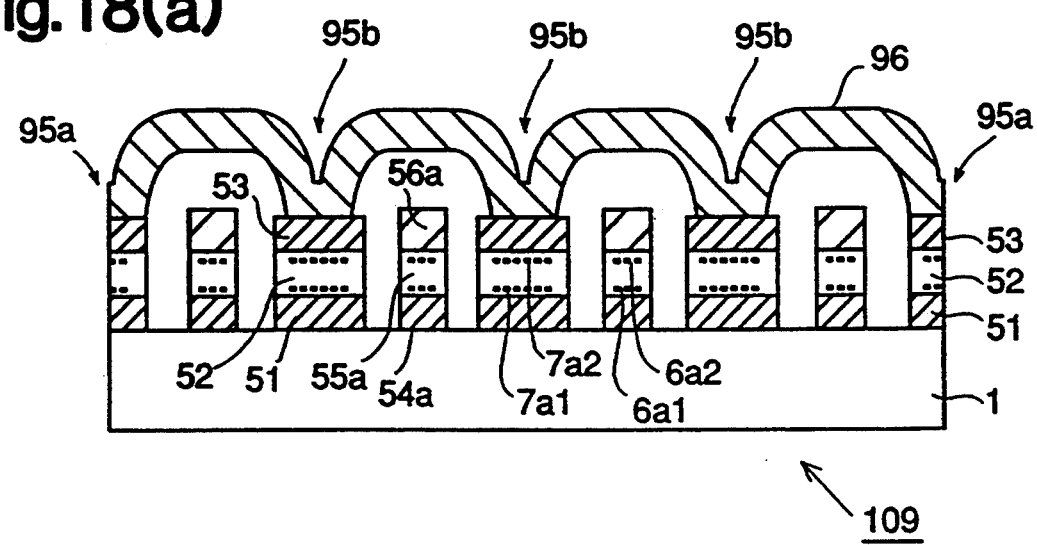
FIGS. 18a–18c are diagrams for explaining a structure of an IPG transistor IC in accordance with a ninth embodiment of the present invention.

FIG. 18(a) is a view for explaining a structure of an IPG transistor IC in accordance with a ninth embodiment of the present invention. In the figure, the same reference numerals as those in FIG. 13 designate the same elements as those of the IPG transistor of the fifth embodiment. An IPG transistor IC 109 of this embodiment employs the IPG transistors having the structure of the fifth embodiment as the IPG transistors constituting the IPG transistor IC of the seventh embodiment. In other words, the IPG transistor employed comprises a channel portion where two quasi-one-dimensional conductive channels 6a1 and 6a2 electrically connecting between the source and drain regions are generated and a gate portion including first and second two-dimensional electron gas layers 7a1 and 7a2 which are produced corresponding to the respective quasi-one-dimensional conductive channels 6a1 and 6a2. An air bridge wiring 96 is provided connecting the second n type AlGaAs layers 53 of the respective gate portions together. Both end gate portions 95a and intermediate gate portions 95b correspond to the gate portions 75a and 75b, respectively. Each the gate portion of the IPG transistor comprises a first n type AlGaAs layer 51 and an i type GaAs layer 52.

Figure 18B:
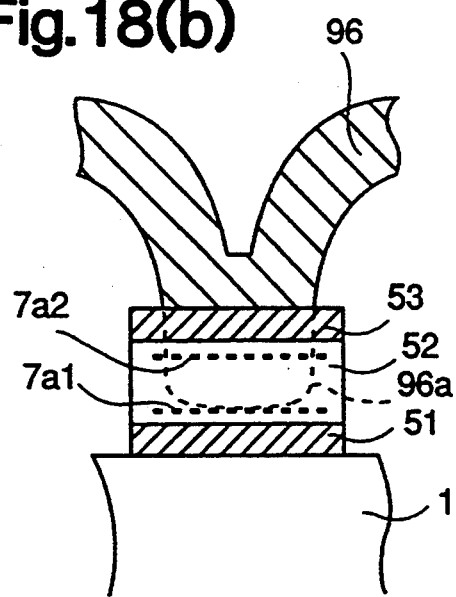

Additionally, in the IPG transistor IC of this embodiment, the connection between the first and second two-dimensional electron gas layers 7a1 and 7a2 in every gate portion and the air bridge wiring 96 is performed by an alloyed portion 96a which is produced by diffusing an constitutive element of the wiring into the gate portion as shown in FIG. 18(b).

Figure 18C:
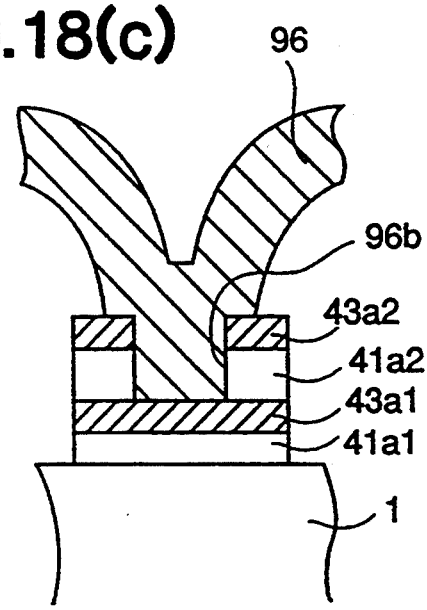

Here, every gate portion can be also constructed by alternatingly laminated SiO₂ films 41a1 and 41a2 and low resistance Au gate layers 43a1 and 43a2 as in the fourth embodiment. In this case, the air bridge wiring 96 connects the respective low resistance gate layers 43a1 and 43a2 together through contact holes 96b which are produced in the respective gate portions as shown in FIG. 18(c).

As described above, according to this embodiment, in the IPG transistor IC of the seventh embodiment, the channel portion of each the IPG transistor has the structure that a plurality of quasi-one-dimensional conductive channels 6a1 and 6a2 are generated and the gate portion of each the IPG transistor has the two-dimensional electron gas layers 7a1 and 7a2 respectively corresponding to the quasi-one-dimensional conductive channels 6a1 and 6a2. Therefore, the operation current of the IPG transistor IC is further increased.

Here, the gate layers are not restricted to the two-dimensional electron gas layers, and they may be low resistance semiconductor layers or metal films as described in the third and fourth embodiments, resulting in the same structure as that of this embodiment. In this case, a gate layer corresponding to each quasi-one-dimensional conductive channel can be produced in each gate portion.

Embodiment 10

Figure 19A:
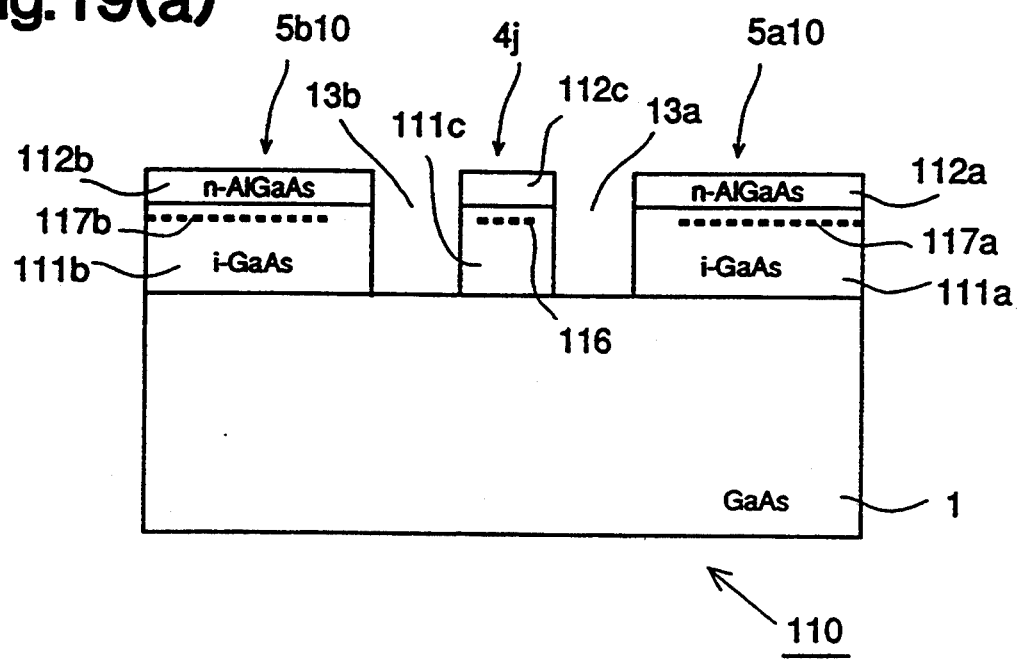
FIGS. 19a and 19b are cross-sectional views illustrating a structure of an IPG transistor by a production method of an IPG transistor in with a tenth embodiment of the present invention.

FIG. 19 is a cross-sectional view illustrating a structure of an IPG transistor produced by a production method of a transistor in accordance with a tenth embodiment of the present invention, and FIG. 20 is a cross-sectional view in the main process steps for explaining the production method of the transistor.

In the figures, an IPG transistor 110 of this embodiment comprises gate portions 5a10 and 5b10 and a channel portion 4j all of which are produced simultaneously, and the other structure is the same as that of the conventional IPG transistor 200.

In more detail, the gate portions 5a10 and 5b10 comprise i type GaAs gate layers 111a and 111b and n type AlGaAs gate layers 112a and 112b, respectively, and the channel portion 4j comprises an i type GaAs channel layer 111c and an n type AlGaAs channel layer 112c. Two-dimensional electron gas layers 117a and 117b are produced in the gate layers 111a and 111b, respectively, and a quasi-one-dimensional conductive channel 116 is generated in the channel layer 111c.

An SiO₂ mask 119a for selective epitaxial growth is produced on a GaAs substrate 1, and it has a strip-shaped pattern. Here, the direction of the strip-shaped pattern of the mask 119a is required to be optimized in connection with the crystallographic surface direction of the GaAs substrate so that side walls of semiconductor regrowth layers which are selectively produced on the GaAs substrate 1 become approximately perpendicular. For this reason, a surface of the surface direction (111) is used as a surface of a wafer 110a as the GaAs substrate on which an epitaxial growth is performed, and {112} direction is selected for the pattern of the SiO₂ mask 119a in this embodiment.

The production method will be described below.

Figure 19B:
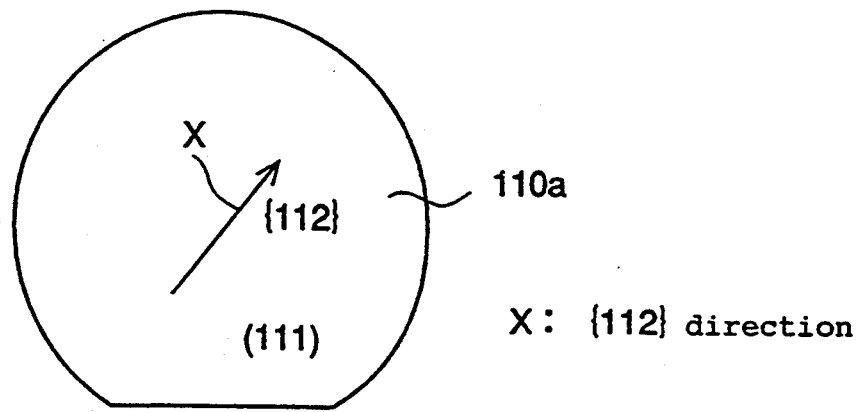
Figure 21:
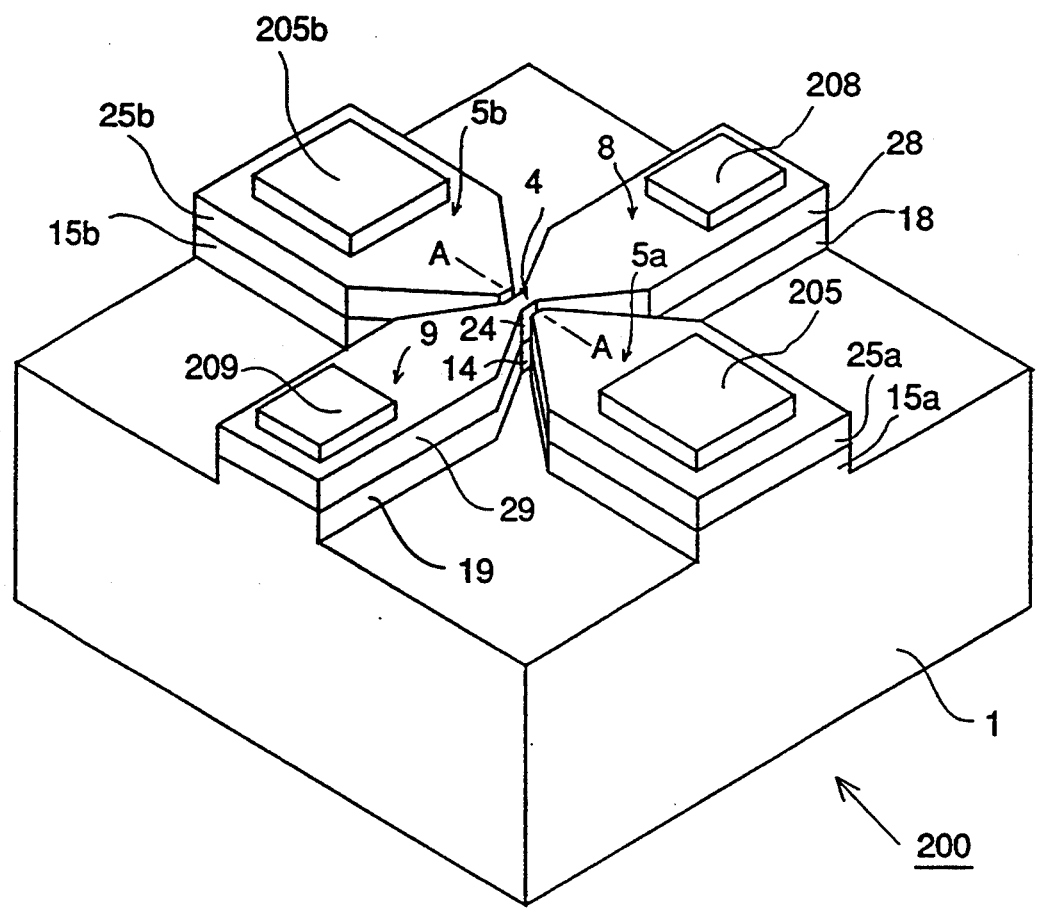
FIG. 21 is a perspective view illustrating a structure of an IPG transistor in accordance with a prior art.

First, the SiO₂ film 119 of a prescribed thickness is produced on the (111) surface of the GaAs wafer 110a shown in FIG. 19(b), and a photoresist film 118 is produced thereon as shown in FIG. 20(a).

The photoresist film 118 is patterned by the usual photolithography, thereby producing a photoresist mask 118a for patterning the SiO₂ film 119. Then, the photoresist mask 118a is patterned so as to have a strip-shaped pattern which is parallel to the {112} direction on the (111) surface of the GaAs wafer 110a as shown in FIG. 20(b).

Thereafter, the SiO₂ film 119 is selectively etched using the photoresist mask 118a, thereby producing the SiO₂ mask 119a for selective epitaxial growth as shown in FIG. 20(c).

An i type GaAs layer and an n type AlGaAs layer are epitaxially grown on the exposed surface of the GaAs substrate 1 as the GaAs wafer 110a using the SiO₂ mask 119a as a mask, thereby simultaneously producing the channel portion 4j comprising the i type GaAs channel layer 111c and the n type AlGaAs channel layer 112c, and the gate portions 5a10 and 5b10 respectively comprising the i type GaAs gate layers 111a and 111b and the n type AlGaAs gate layers 112a and 112b as shown in FIG. 20(e).

At last, the SiO₂ mask 119a is removed, thereby completing the IPG transistor 110 as shown in FIG. 20(f).

As described above, in this embodiment, after a pair of selective growth masks 119a confronting to each other with a prescribed interval are produced on the substrate, the semiconductor layers are selectively grown using a pair of the selective growth films as a mask, thereby producing the channel portion 4j where the quasi-one-dimensional conductive channel 6 is generated between both the selective growth films on the substrate, and at the same time, producing the gate portions 5a10 and 5b10 respectively including the two-dimensional electron gas layers 117a and 117b for controlling generation and forfeiture of the quasi-one-dimensional conductive channel at outside the region put between the selective growth films on the substrate. Therefore, gap grooves 13a and 13b of a high aspect ratio are produced between the channel and the gates without being restricted by the dry etching technique, resulting in the IPG transistor of a high element performance of a high mutual conductance and a small gate capacity.

Further, in this embodiment, although the channel portion and the gate portions cannot be produced with layers comprising different materials from each other, the IPG transistor is completed by a lower number of process steps.

What is claimed is:

1. A semiconductor integrated circuit device comprising:
   a substrate;
   a plurality of in-plane-gate (IPG) transistors mounted on said substrate, each transistor having:
   a channel portion where a quasi-one-dimensional conductive channel electrically connecting a source region and a drain region is generated, said quasi-one-dimensional conductive channel being disposed in a plane; and
   a gate portion including a two-dimensional electron gas layer disposed in the same plane as the quasi-one-dimensional conductive channel, generation and forfeiture of the quasi-one-dimensional conductive channel being controlled by application of a gate voltage to said two-dimensional electron gas layer; and
   wherein said semiconductor integrated circuit device comprises:

a depletion type IPG transistor having said channel portion of a width so that a path between said source region and said drain region is in an electrically conductive state when no gate voltage is applied; and an enhancement type IPG transistor having said channel portion of a width so that the quasi-one-dimensional conductive channel is forfeited because of surface depletion layers of said channel portion when no gate voltage is applied.

2. An in-plane-gate transistor comprising:

a substrate;

a channel portion where a planar quasi-one-dimensional conductive channel electrically connecting a source region and a drain region is generated, said channel portion being disposed on said substrate; and gate portions, each gate portion including a gate layer for controlling generation and forfeiture of the quasi-one-dimensional conductive channel, a respective gate portion being disposed at each of two opposite sides of the channel portion on said substrate, said gate layer including a low resistance thin film selected from the group consisting of a semiconductor film including a dopant impurity and a metal film, an upper surface of said low resistance thin film being positioned in the same plane as the quasi-one-dimensional conductive channel.

3. An in-plane-gate transistor comprising:

a substrate;

a channel portion where a plurality of quasi-one-dimensional conductive channels electrically connecting a source region and a drain region are generated, said channel portion being disposed on said substrate; and gate portions, each gate portion including a laminated gate layer for controlling generation and forfeiture of the quasi-one-dimensional conductive channels, a respective gate portion being disposed at each of two opposite sides of said channel portion on said substrate, a plurality of planar quasi-one-dimensional conductive channels being produced in a thickness direction of said channel portion parallel to each other in the same planes as respective two-dimensional electron gas layers in said gate portions.

4. The in-plane-gate transistor of claim 3 wherein said gate layer comprises a plurality of conductive thin films for producing the two-dimensional electron gas layers in approximately the same planes as and corresponding to the quasi-one-dimensional conductive channels in said channel portion.

5. The in-plane-gate transistor of claim 2 wherein said gate portions at two opposite sides of said channel portion are electrically isolated from said channel portion by air gaps between said gate portions and said channel portion and are respectively connected to different signal sources.

6. A semiconductor integrated circuit device comprising:

a substrate;

a plurality of in-plane-gate transistors, each transistor having:

a channel portion where a planar quasi-one-dimensional conductive channel electrically connecting a source region and a drain region is generated, said channel portion being disposed on said substrate; and gate portions, each gate portion including a gate layer in the same plane as the quasi-one-dimensional conductive channel for controlling generation and forfeiture of the quasi-one-dimensional conductive channel, a respective gate portion being disposed at each of two opposite sides of said channel portion on said substrate; and wherein each of said channel portions has a structure so that a plurality of quasi-one-dimensional conductive channels are generated and arranged in a thickness direction of said channel portion parallel to each other and said semiconductor integrated circuit device comprises an air bridge wiring spaced from said channel portions between adjacent gate portions and electrically connecting said gate layers of the respective in-plane-gate transistors.

7. The semiconductor integrated circuit device of claim 6 wherein each of said gate portions of each of said in-plane-gate transistors includes a plurality of conductive thin films for producing a plurality of two-dimensional electron gas layers in approximately the same planes as corresponding quasi-one-dimensional conductive channels in said channel portion.

8. The semiconductor integrated circuit device of claim 7 wherein each of said gate portions includes layers of two different semiconductor materials and said air bridge wiring and respective semiconductor material layers of said gate portions of each in-plane-gate transistor are connected through alloyed portions of said air bridge wiring.

9. The semiconductor integrated circuit device of claim 7 wherein said gate portions include metal films and said air bridge wiring and respective metal films of said gate portions of each in-plane-gate transistor are connected through contact holes in the respective gate portions.

* * * * *